(12) United States Patent
Okawauchi et al.

(10) Patent No.: US 12,376,349 B2
(45) Date of Patent: Jul. 29, 2025

(54) SEMICONDUCTOR DEVICE WITH SWITCHING ELEMENTS CONNECTED IN SERIES

(71) Applicant: ROHM CO., LTD., Kyoto (JP)

(72) Inventors: Yuta Okawauchi, Kyoto (JP); Yasuo Kanetake, Kyoto (JP); Tatsuya Miyazaki, Kyoto (JP); Takukazu Otsuka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 313 days.

(21) Appl. No.: 17/910,460

(22) PCT Filed: Mar. 15, 2021

(86) PCT No.: PCT/JP2021/010337
§ 371 (c)(1),
(2) Date: Sep. 9, 2022

(87) PCT Pub. No.: WO2021/187409
PCT Pub. Date: Sep. 23, 2021

(65) Prior Publication Data
US 2023/0132511 A1 May 4, 2023

(30) Foreign Application Priority Data
Mar. 19, 2020 (JP) .................. 2020-048985

(51) Int. Cl.
*H10D 48/00* (2025.01)
*H10D 1/00* (2025.01)
(Continued)

(52) U.S. Cl.
CPC .......... *H10D 48/021* (2025.01); *H10D 1/045* (2025.01); *H10D 30/4732* (2025.01);
(Continued)

(58) Field of Classification Search
CPC ......... H01L 29/66022; H01L 29/41766; H01L 29/1608
See application file for complete search history.

(56) References Cited

U.S. PATENT DOCUMENTS 8,547,677 B2 * 10/2013 Anthony ................ H01G 4/232
361/118
9,343,388 B2 * 5/2016 Terai ........................ H01L 24/73
(Continued)

FOREIGN PATENT DOCUMENTS

JP  2009-158787 A  7/2009
JP  2013-162019 A  8/2013

OTHER PUBLICATIONS

H. Sheng, Z. Chen, F. Wang and A. Millner, "Investigation of 1.2 kV SiC MOSFET for high frequency high power applications," 2010 Twenty-Fifth Annual IEEE Applied Power Electronics Conference and Exposition (APEC), Palm Springs, CA, USA, 2010, pp. 1572-1577 (Year: 2010).*

(Continued)

*Primary Examiner* — Xanthia C Relford
(74) *Attorney, Agent, or Firm* — HSML P.C.

(57) ABSTRACT

A semiconductor device includes a first and a second switching element, a first and a second conductive member, and a capacitor. The first switching element has a first element obverse surface and a first element reverse surface facing away from each other in a first direction. The second switching element has a second element obverse surface and a second element reverse surface facing away from each other in the first direction. The first and second conductive members are spaced apart in a second direction orthogonal to the first direction. The capacitor has a first and a second connection terminal. The first and second switching elements are connected in series, forming a bridge. The first and second connection terminals are electrically connected to (Continued)

opposite ends of the bridge. The capacitor and the first switching element are on the first conductive member, the second switching element on the second conductive member.

19 Claims, 29 Drawing Sheets

(51) Int. Cl.
    *H10D 30/47*     (2025.01)
    *H10D 30/69*     (2025.01)
    *H10D 48/01*     (2025.01)
    *H10D 62/13*     (2025.01)
    *H10D 62/83*     (2025.01)

(52) U.S. Cl.
    CPC ......... *H10D 30/721* (2025.01); *H10D 62/151* (2025.01); *H10D 62/8303* (2025.01)

(56) References Cited

U.S. PATENT DOCUMENTS

| | | | |
|---|---|---|---|
| 9,455,207 B2 * | 9/2016 | Kim | H01L 23/043 |
| 9,485,893 B2 * | 11/2016 | Tramet | H05K 9/0028 |
| 9,521,781 B2 * | 12/2016 | Frank | H01F 27/22 |
| 10,237,991 B2 * | 3/2019 | Kondo | H01G 2/06 |
| 2008/0023843 A1 * | 1/2008 | Hiraga | H01L 23/49531 |
| | | | 257/773 |
| 2014/0268780 A1 * | 9/2014 | Wang | H05K 1/028 |
| | | | 362/249.06 |
| 2015/0326221 A1 | 11/2015 | Totani | |
| 2017/0148770 A1 * | 5/2017 | Ishino | H01L 24/48 |
| 2017/0229953 A1 * | 8/2017 | Otake | H10D 62/8325 |
| 2018/0090473 A1 | 3/2018 | Nakahara | |
| 2018/0294102 A1 * | 10/2018 | Trinh | H01G 4/30 |
| 2019/0258302 A1 * | 8/2019 | Aoki | C09D 179/08 |
| 2020/0035656 A1 | 1/2020 | Miyazaki et al. | |
| 2020/0251409 A1 * | 8/2020 | Saito | H01L 24/06 |

OTHER PUBLICATIONS

Sang-Ki Yun and Hai-Young Lee, "Parasitic impedance analysis of double bonding wires for high-frequency integrated circuit packaging," in IEEE Microwave and Guided Wave Letters, vol. 5, No. 9, pp. 296-298, Sep. 1995, doi: 10.1109/75.410403. (Year: 1995).*
Office Action received in the corresponding German Patent application, Nov. 22, 2022 and machine translation (14 pages).
International Search Report issued in PCT/JP2021/010337, Jun. 15, 2021 (2 pages) .

* cited by examiner

SEMICONDUCTOR DEVICE WITH SWITCHING ELEMENTS CONNECTED IN SERIES

TECHNICAL FIELD

The present disclosure relates to a semiconductor device.

BACKGROUND ART

Semiconductor devices with power switching elements such as MOSFETs (Metal Oxide Semiconductor Field Effect Transistors) or IGBTs (Insulated Gate Bipolar Transistors) are conventionally known. For example, a semiconductor device with two switching elements connected in series is disclosed in Patent Document 1. Such a semiconductor device may be mounted on a circuit board of an electronic device and used in a power supply circuit (e.g., a DC/DC converter or an inverter) or a motor drive circuit.

TECHNICAL REFERENCE

Patent Document

Patent Document 1: JP-A-2009-158787

SUMMARY OF THE INVENTION

Problems to be Solved by the Invention

With the recent demand for energy saving and higher performance in electronic devices, semiconductor devices are required to have reduced power consumption and improved responsiveness of switching. To reduce power consumption and improve the responsiveness of switching, reducing inductance is effective. Reducing inductance contributes to the reduction in surge voltage applied to the switching elements.

In light of the above circumstances, an object of the present disclosure is to provide a semiconductor device configured to reduce the surge voltage applied to the switching elements.

Means for Solving the Problems

The semiconductor device provided according to the present disclosure includes a first switching element having a first element obverse surface and a first element reverse surface facing away from each other in a first direction; a second switching element having a second element obverse surface and a second element reverse surface facing away from each other in the first direction; a first conductive member and a second conductive member spaced apart from each other in a second direction orthogonal to the first direction; and a capacitor having a first connection terminal and a second connection terminal. The first switching element and the second switching element are connected in series to form a bridge. The first connection terminal and the second connection terminal are electrically connected to opposite ends of the bridge. The capacitor and the first switching element are mounted on the first conductive member, and the second switching element is mounted on the second conductive member.

Advantages of the Invention

The above configuration can reduce the surge voltage applied to the switching elements (first switching elements and second switching elements).

MODE FOR CARRYING OUT THE INVENTION

Figure 1:
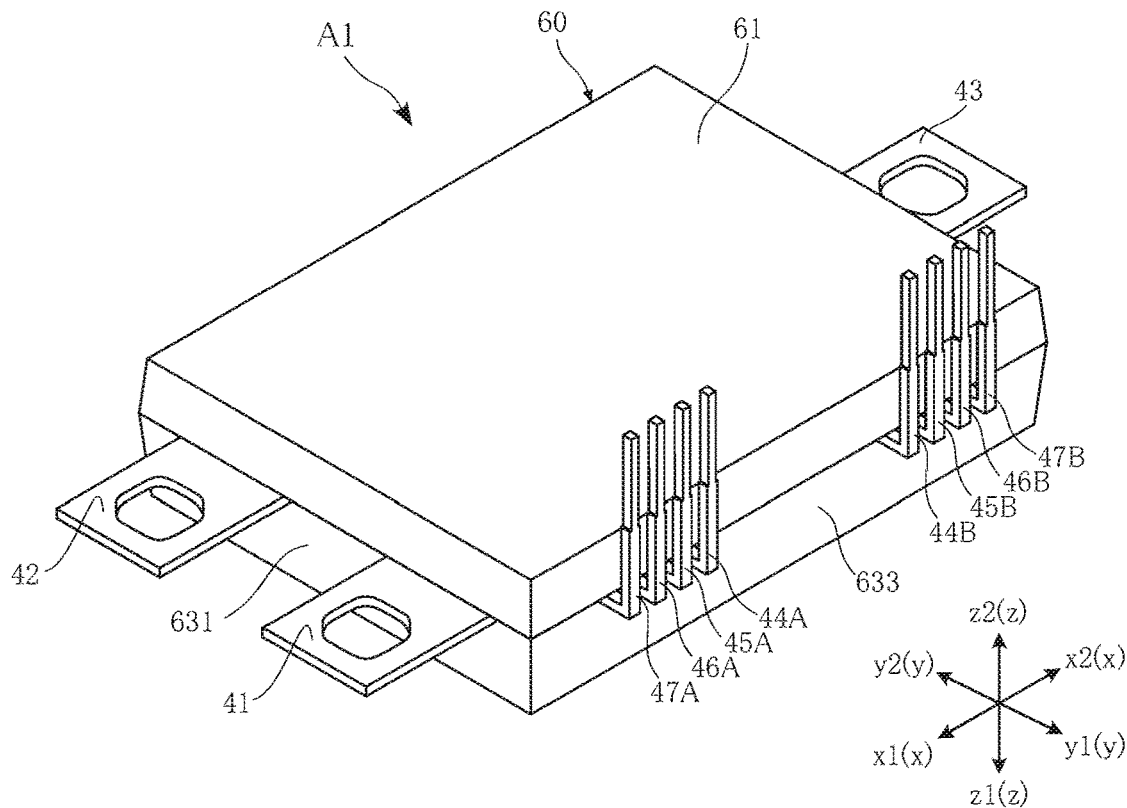
FIG. 1 is a perspective view of a semiconductor device according to a first embodiment.

Preferred embodiments of a semiconductor device according to the present disclosure are described below with reference to the accompanying drawings. In the description below, identical or similar elements are denoted by the same reference signs, and description of such elements are omitted.

FIGS. 1 to 14 show a semiconductor device A1 according to a first embodiment. The semiconductor device A1 has a plurality of switching elements 10, a supporting substrate 20, a pair of signal substrates 30A and 30B, two input terminals 41 and 42, an output terminal 43, a plurality of signal terminals 44A to 47A and 44B to 47B, a plurality of connectors 50, and a resin member 60.

Figure 2:
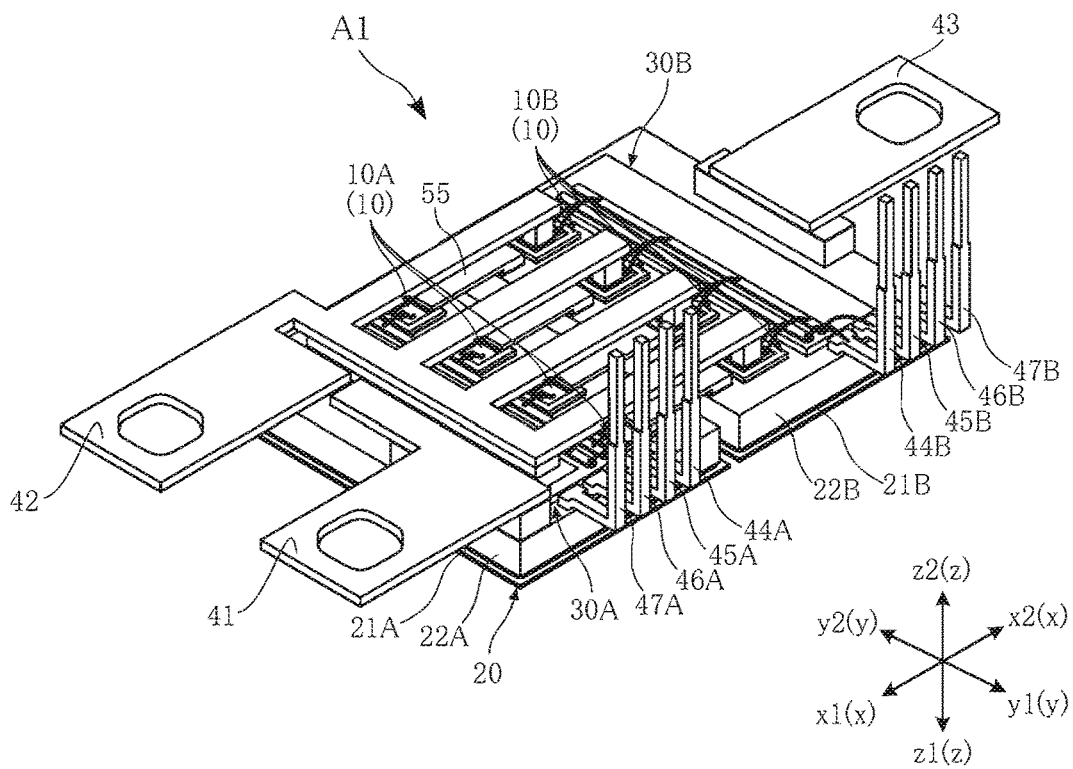
FIG. 2 is a view showing the semiconductor device of FIG. 1, with a resin member omitted.
Figure 3:
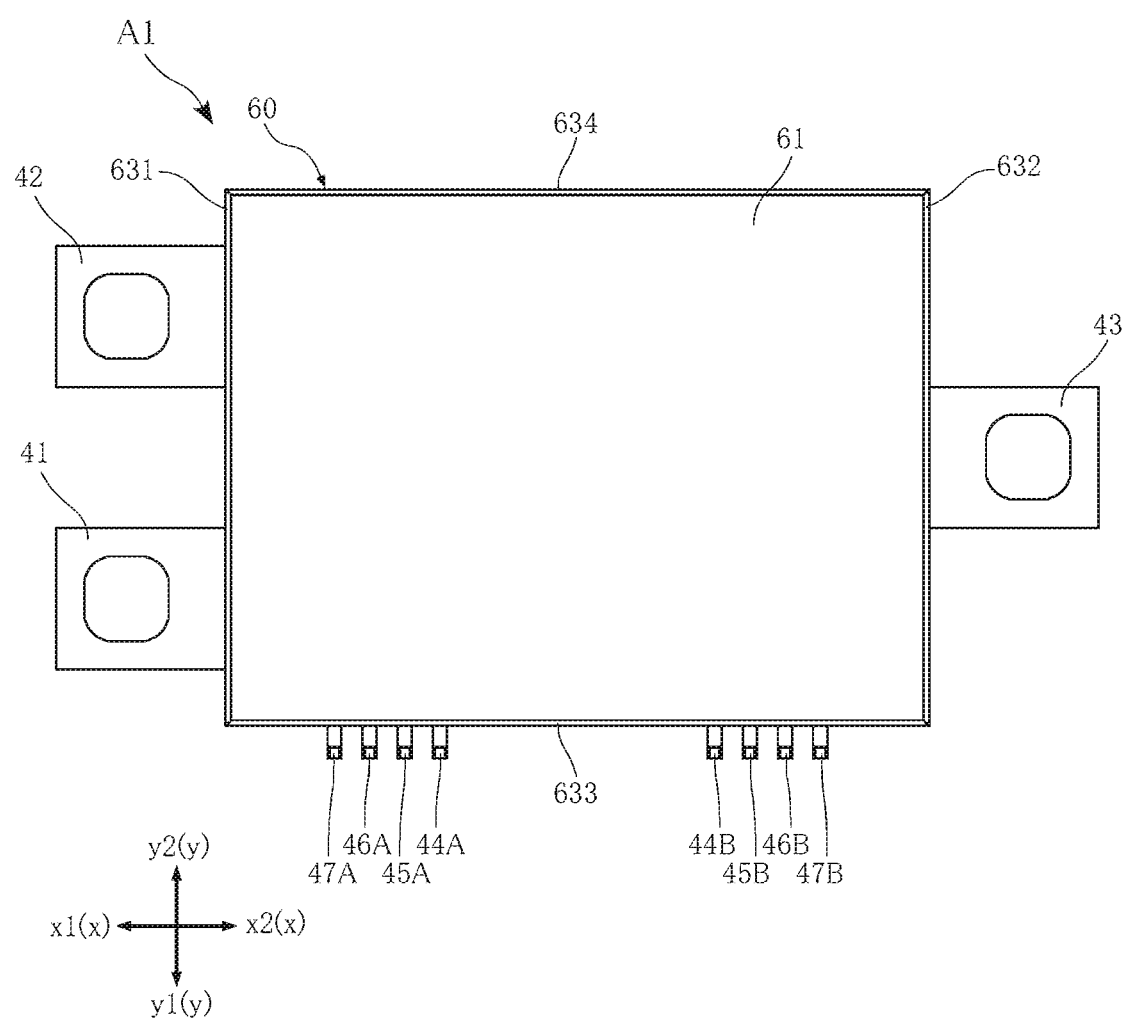
FIG. 3 is a plan view of the semiconductor device according to the first embodiment.
Figure 4:
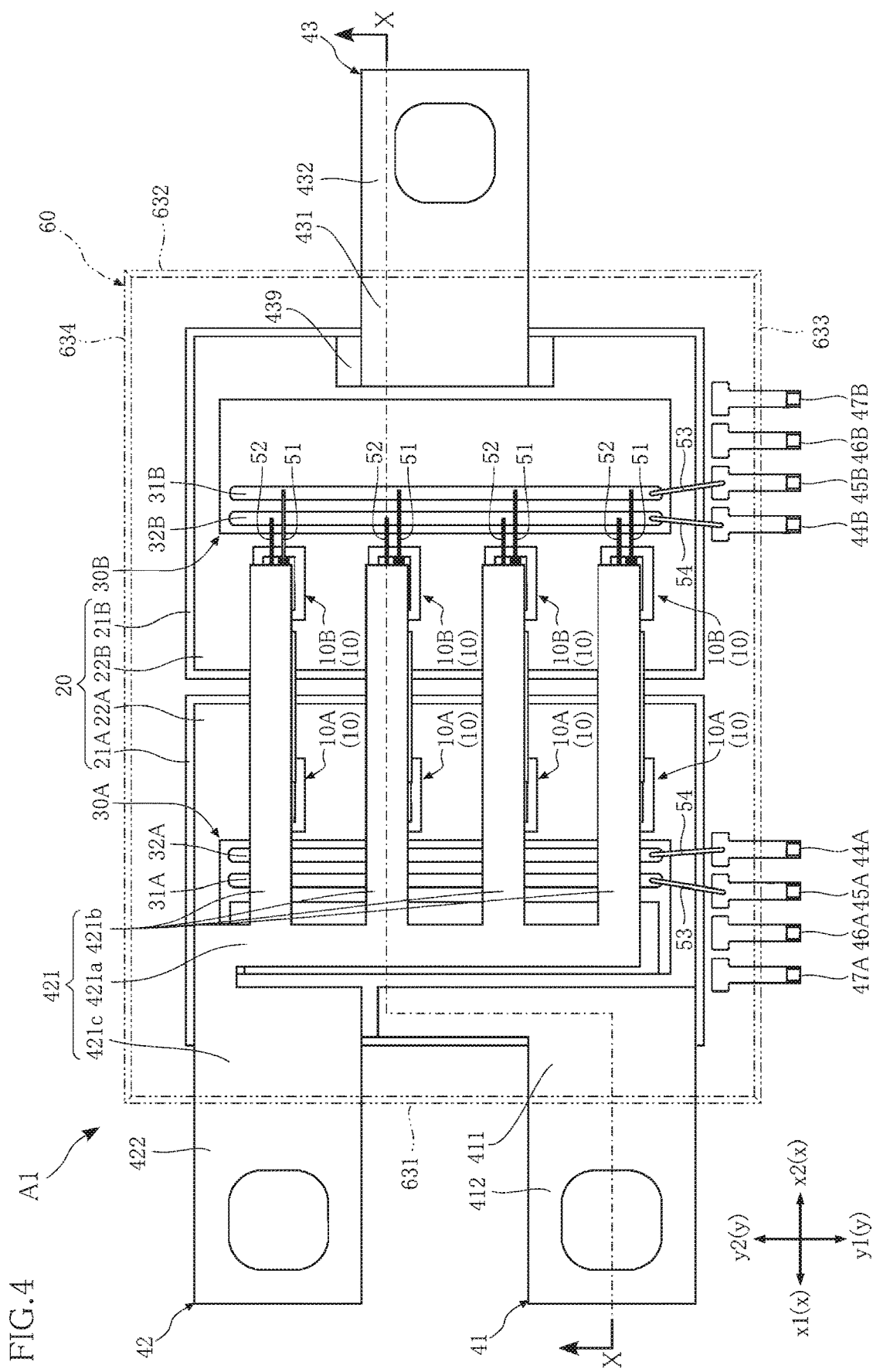
FIG. 4 is a plan view corresponding to FIG. 3, in which the resin member is shown by imaginary lines.
Figure 5:
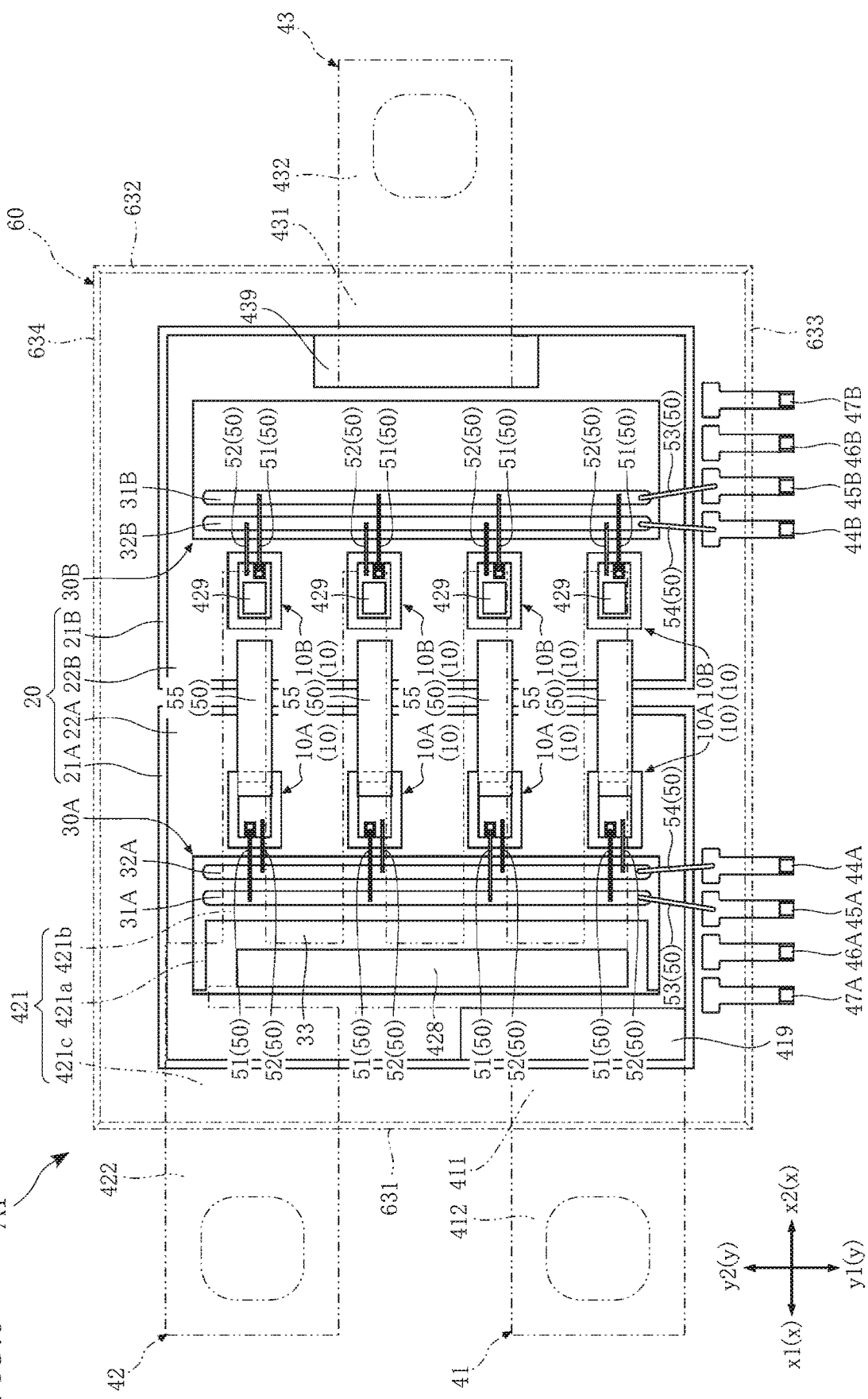
FIG. 5 is a plan view corresponding to FIG. 4, in which two input terminals and an output terminal are shown by imaginary lines.
Figure 6:
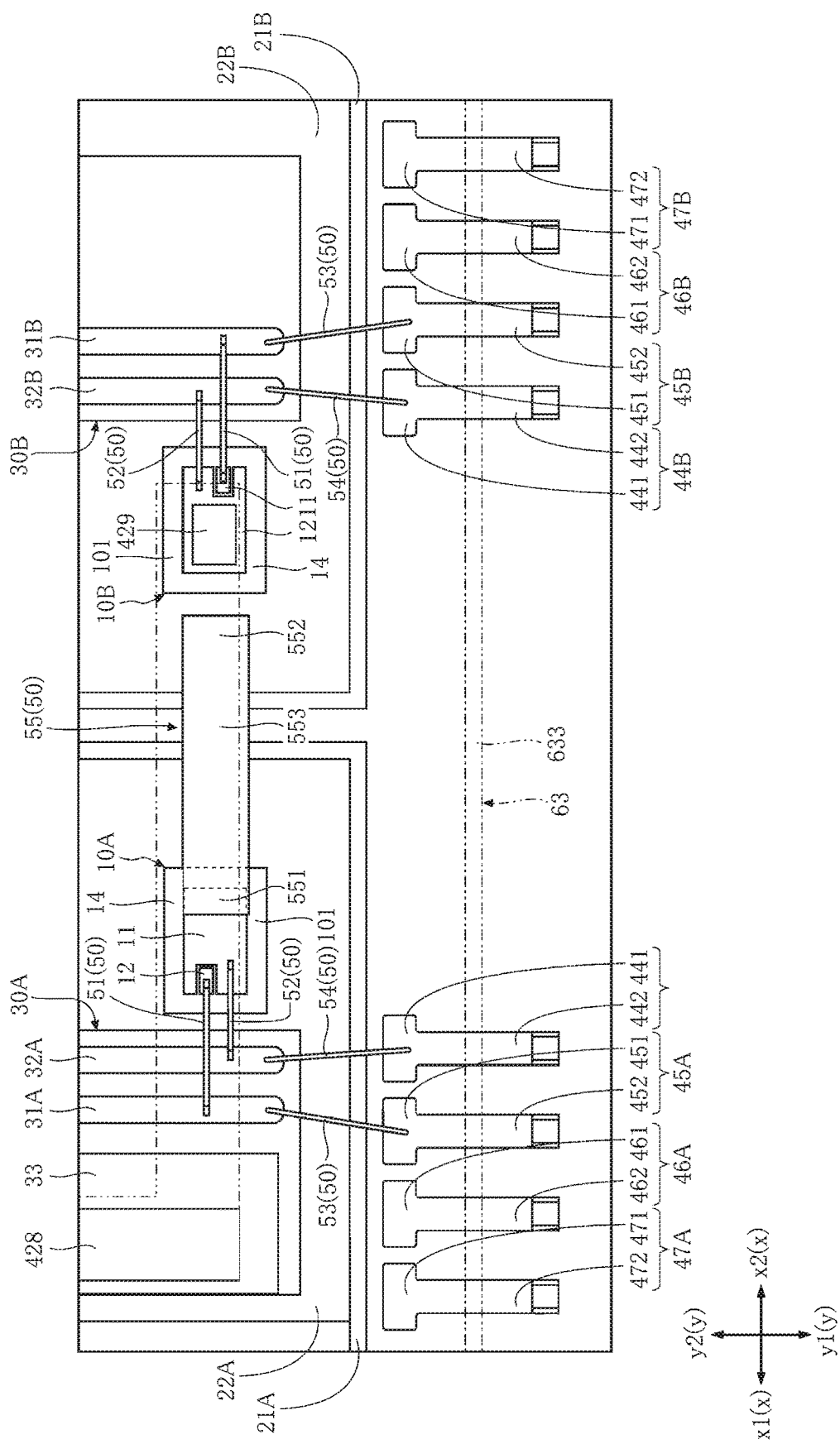
FIG. 6 is an enlarged view showing a part of FIG. 5.
Figure 7:
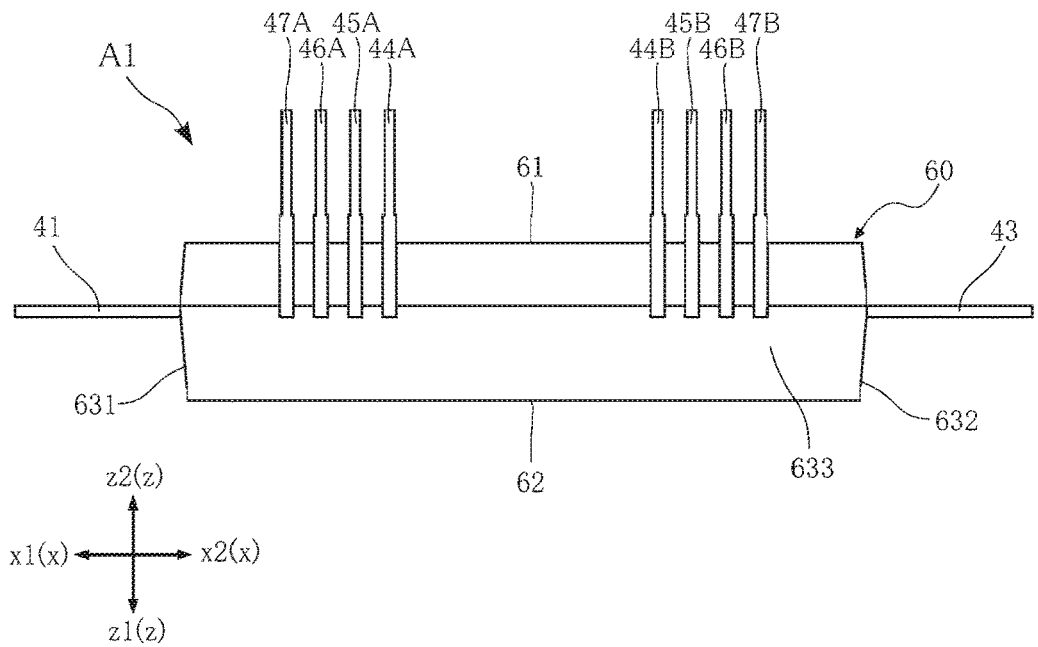
FIG. 7 is a front view of the semiconductor device according to the first embodiment.
Figure 8:
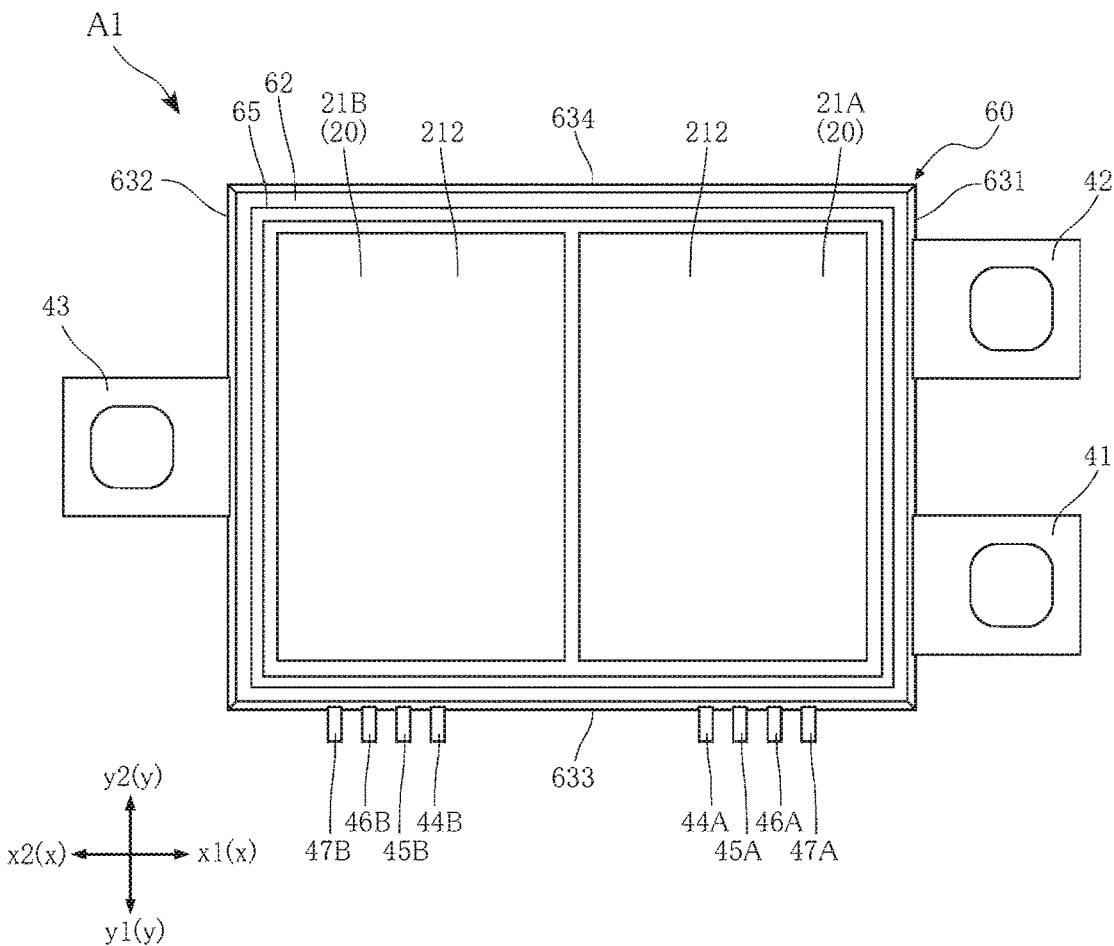
FIG. 8 is a bottom view of the semiconductor device according to the first embodiment.
Figure 9:
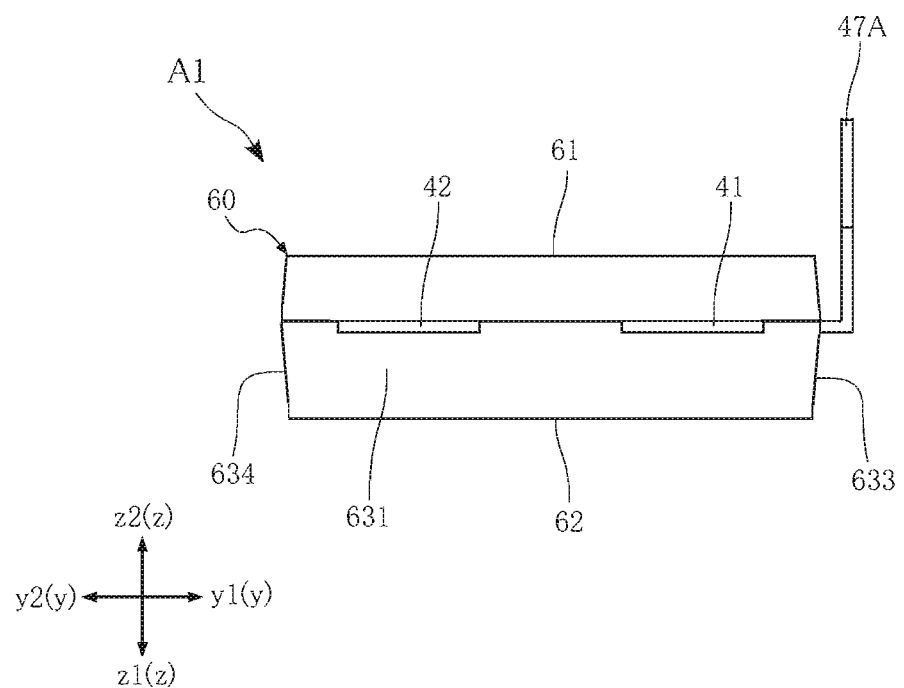
FIG. 9 is a left side view of the semiconductor device according to the first embodiment.
Figure 10:
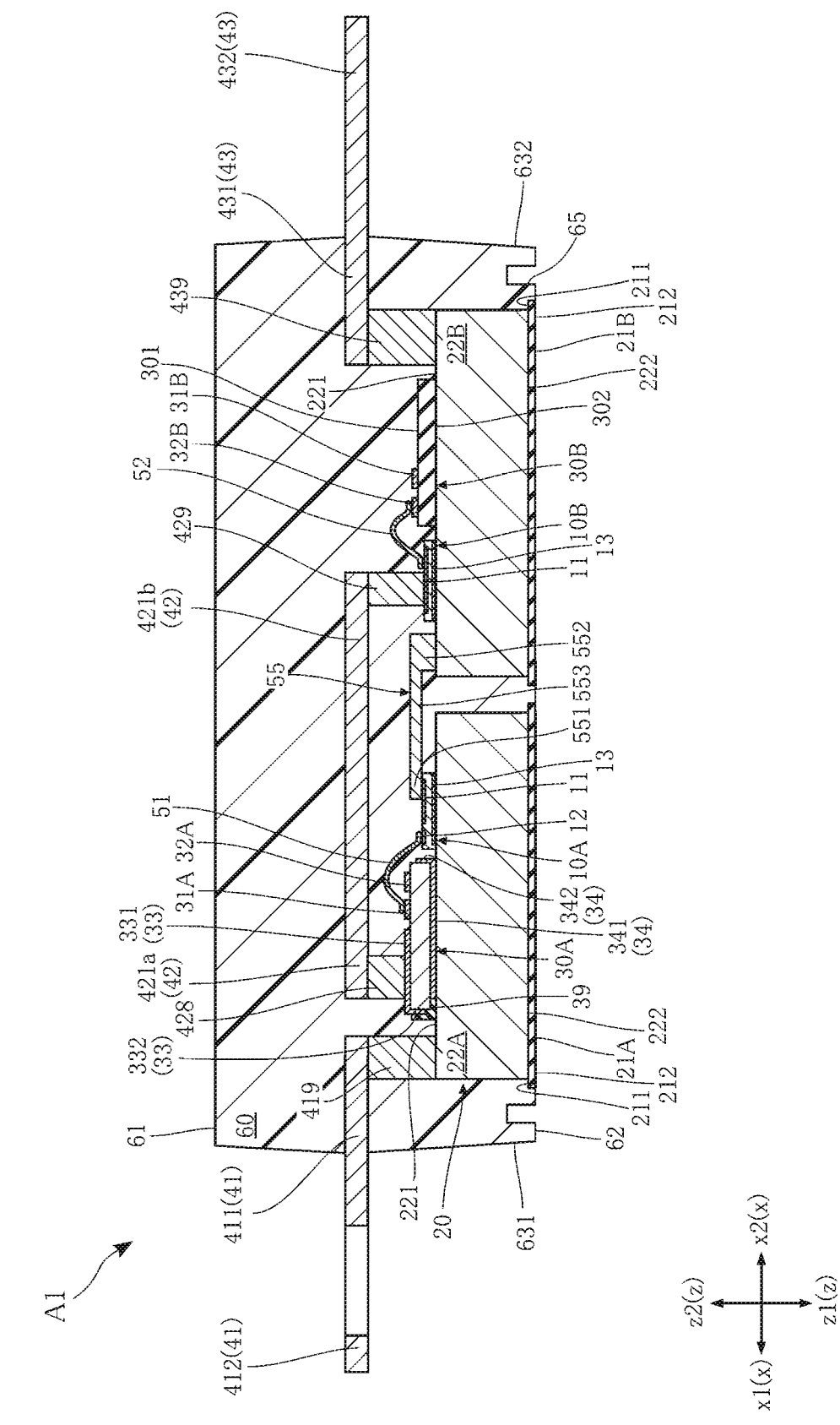
FIG. 10 is a sectional view taken along line X-X in FIG. 4.
Figure 11:
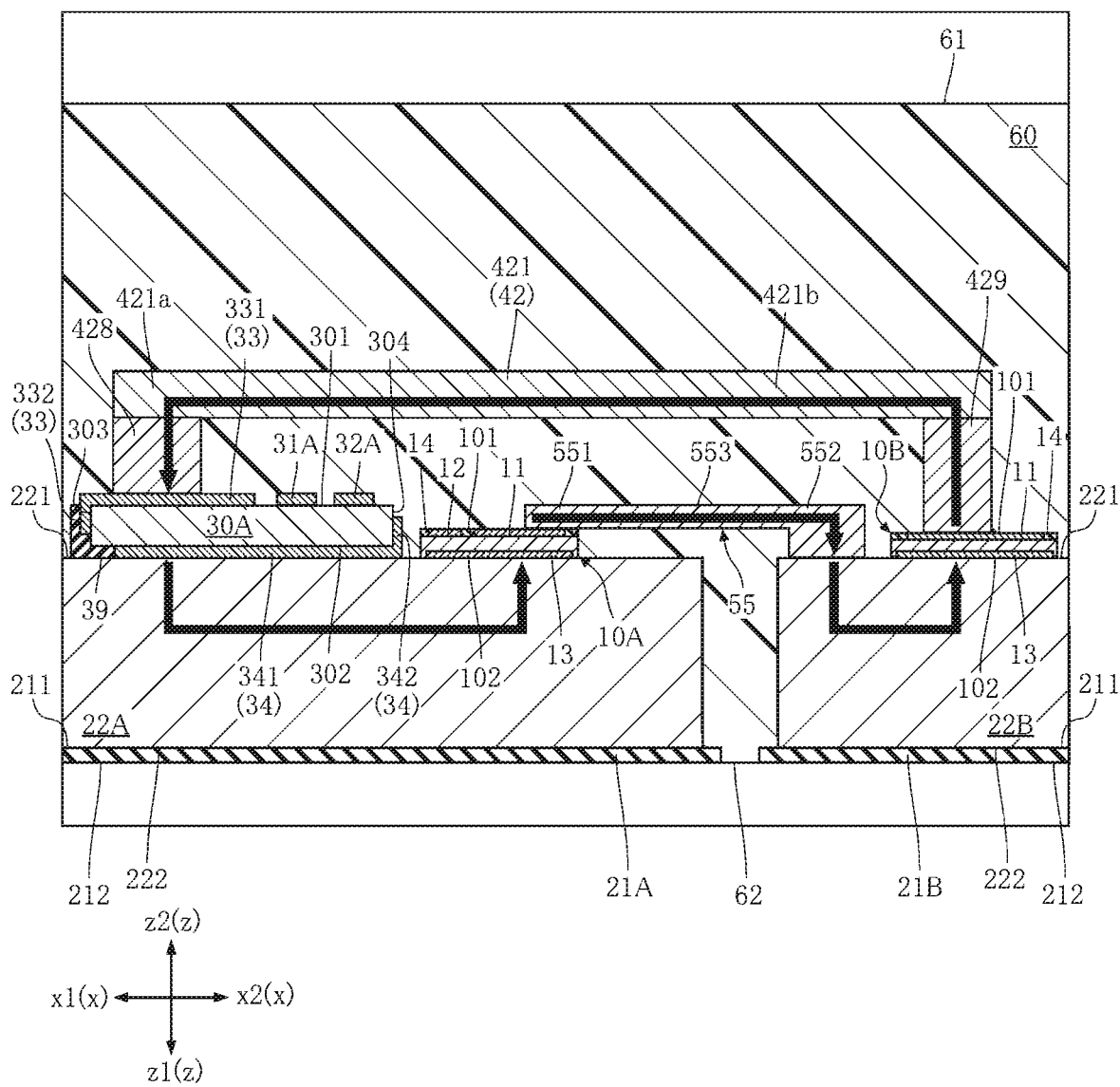
FIG. 11 is an enlarged sectional view showing a part of FIG. 10.
Figure 12:
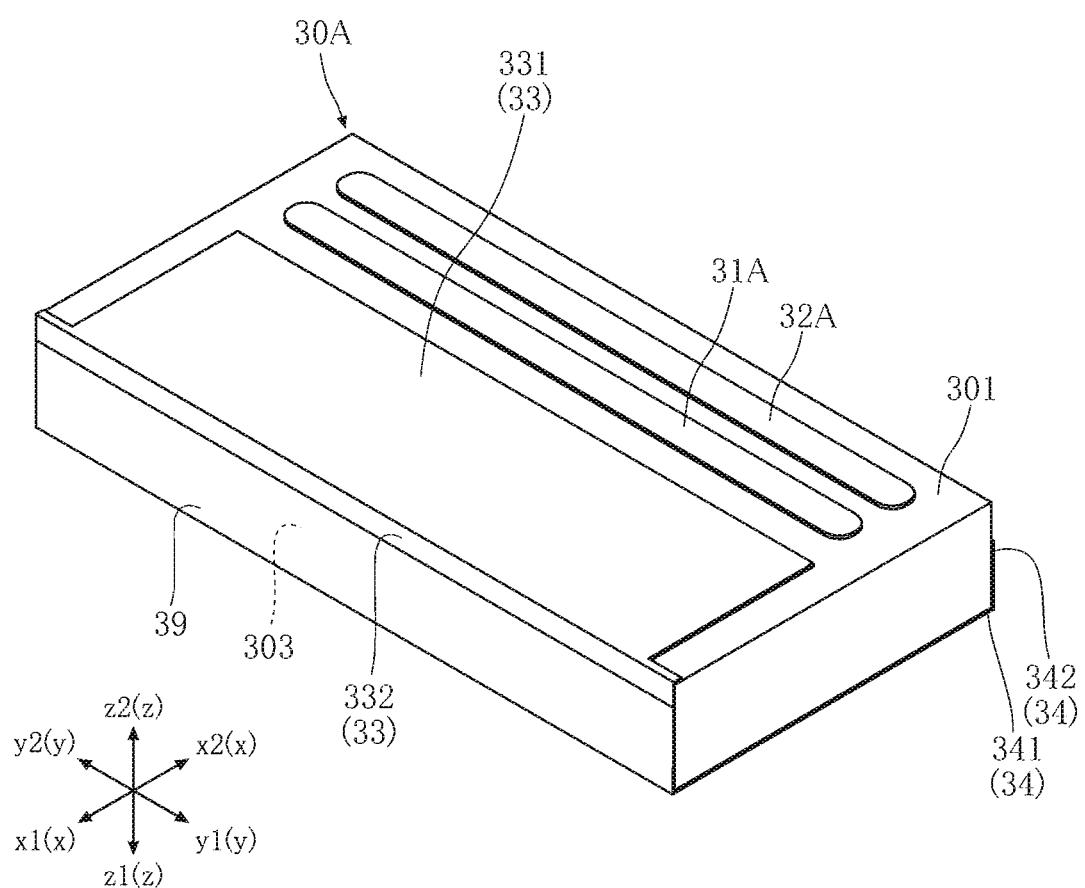
FIG. 12 is a perspective view showing a signal substrate (a capacitor built-in substrate)
Figure 13:
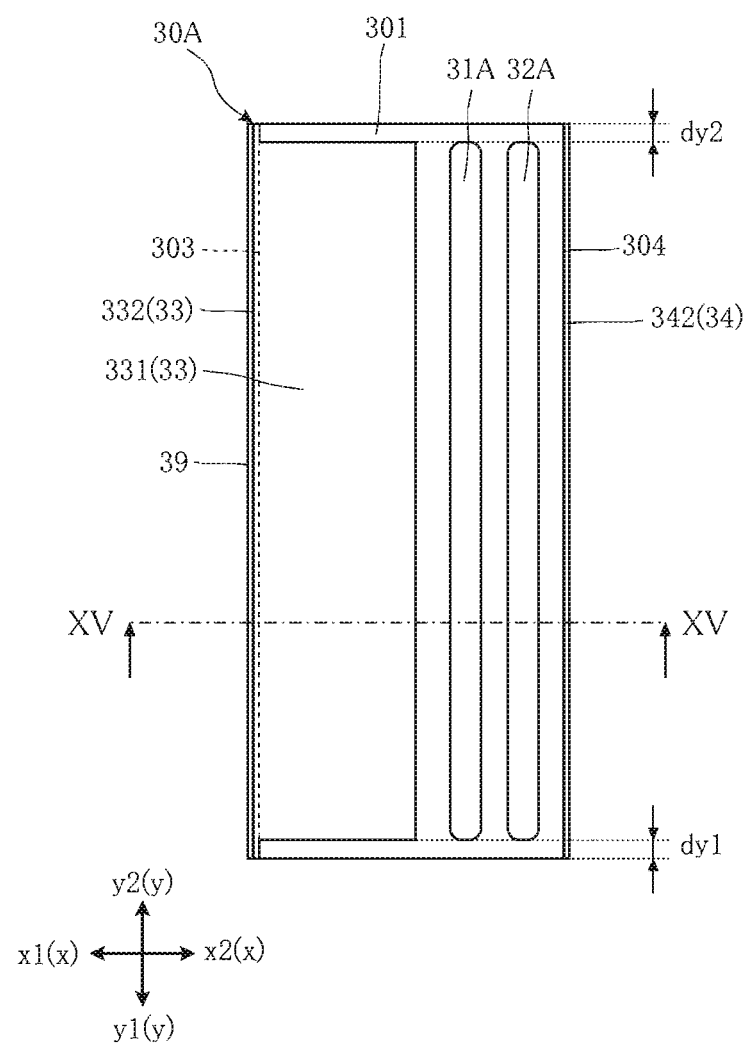
FIG. 13 is a plan view showing the signal substrate (a capacitor built-in substrate)
Figure 14:
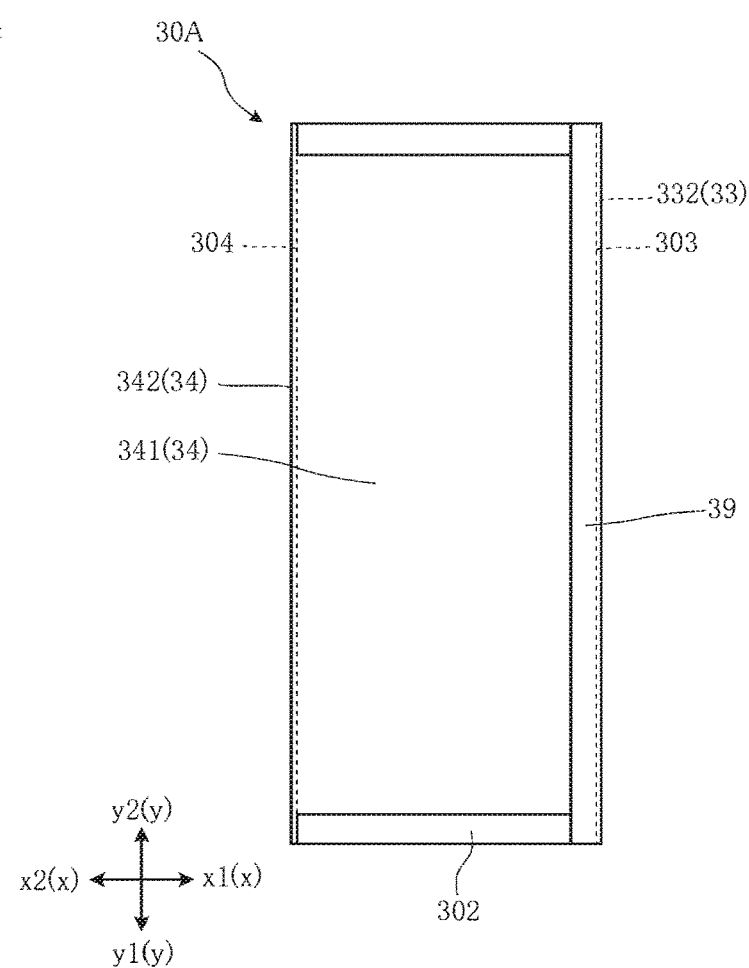
FIG. 14 is a bottom view showing the signal substrate (a capacitor built-in substrate)

FIG. 1 is a perspective view of the semiconductor device A1. FIG. 2 is a perspective view corresponding to FIG. 1, in which the resin member 60 is omitted. FIG. 3 is a plan view of the semiconductor device A1. FIG. 4 is a plan view corresponding to FIG. 3, in which the resin member 60 is shown by imaginary lines (two-dot chain lines). FIG. 5 is a plan view corresponding to FIG. 4, in which two input terminals 41 and 42 and the output terminal are shown by imaginary lines. FIG. 6 is an enlarged view showing a part of FIG. 5. FIG. 7 is a front view of the semiconductor device A1. FIG. 8 is a bottom view of the semiconductor device A1. FIG. 9 is a side view (left side view) of the semiconductor device A1. FIG. 10 is a sectional view taken along line X-X in FIG. 4. FIG. 11 is an enlarged sectional view showing a part of FIG. 10. In FIG. 11, the connectors 50 are omitted. FIG. 12 is a perspective view of the signal substrate 30A. FIG. 13 is a plan view of the signal substrate 30A. FIG. 14 is a bottom view of the signal substrate 30A.

For convenience of explanation, the three mutually orthogonal directions are referred to as x direction, y direction, and z direction, as appropriate. The z direction is the thickness direction of the semiconductor device A1. The x direction is the horizontal direction in the plan view (see FIG. 3) of the semiconductor device A1. The y direction is the vertical direction in the plan view (see FIG. 3) of the semiconductor device A1. One sense of the x direction is referred to as x1 direction, and the other sense of the x direction is referred to as x2 direction. Similarly, one sense of the y direction is referred to as y1 direction, and the other sense of the y direction is referred to as y2 direction. Also, one sense of the z direction is referred to as z1 direction, and the other sense of the z direction is referred to as z2 direction. In the description below, "in plan view" means as viewed along the z direction. The z direction is an example of "first direction", and the x direction is an example of "second direction".

The switching elements 10 are made using a semiconductor material, which may mainly contain silicon carbide (SiC). The semiconductor material is not limited to SiC and may be silicon (Si), gallium arsenide (GaAs), or gallium nitride (GaN), for example. Preferably, a wide-band-gap semiconductor material is used. Each switching element 10 may be a MOSFET, but is not limited to a MOSFET. Each switching element 10 may be other transistors such as field-effect transistors including MISFETs (Metal-Insulator-Semiconductor FETs) or bipolar transistors including IGBTs. The switching elements 10 are all of the same type and may be n-channel MOSFETs, for example. The illustrated switching elements 10 are rectangular in plan view, but the present disclosure is not limited to this.

Each of the switching elements 10 has an element obverse surface 101 and an element reverse surface 102, as shown in FIG. 11. In each switching element 10, the element obverse surface 101 and the element reverse surface 102 are spaced apart from each other in the z direction. The element obverse surface 101 faces in the z2 direction, and the element reverse surface 102 faces in the z1 direction.

Each of the switching elements 10 has a first electrode 11, a second electrode 12, a third electrode 13, and an insulating film 14. As shown in FIGS. 6 and 11, the first electrode 11 and the second electrode 12 are on the element obverse surface 101. The first electrode 11 may be a source electrode, through which a source current flows. The second electrode 12 may be a gate electrode, to which a gate voltage for driving the switching element 10 is applied. In plan view, the first electrode 11 is larger than the second electrode 12. In the example shown in FIG. 6, the first electrode 11 is constituted by a single region, but the first electrode may be divided into a plurality of regions. As shown in FIG. 11, the third electrode 13 is on the element reverse surface 102. The second electrode 12 may be a drain electrode, through which a drain current flows. In the illustrated example, the third electrode 13 is formed almost entirely on the element reverse surface 102. (The third electrode 13 is formed on the entire element reverse surface 102 except its peripheral region, which has a relatively small area.) As shown in FIGS. 6 and 11, the insulating film 14 is on the element obverse surface 101. The insulating film 14 is electrically insulating. The insulating film 14 surrounds the first electrode 11 and the second electrode 12 in plan view. The insulating film 14 insulates the first electrode 11 and the second electrode 12 on the element obverse surface 101. The insulating film 14 may be a laminate of a silicon dioxide ($SiO_2$) layer, a silicon nitride ($SiN_4$) layer, and a polybenzoxazole layer, which are laminated on the element obverse surface 101 in that order. The structure of the insulating film 14 is not limited to the above, and a polyimide layer may be used instead of a polybenzoxazole layer.

Each of the switching elements 10 performs a switching operation in response to a predetermined signal. Specifically, when a drive signal (e.g., gate voltage) is input to the second electrode 12 (gate electrode), the switching element switches between a conducting state and a blocked state in accordance with the drive signal. In the conducting state, current flows from the third electrode 13 (drain electrode) to the first electrode 11 (source electrode). In the blocked state, current does not flow. The frequency of the drive signal (i.e., the switching frequency of each switching element 10) may be 10 kHz or higher.

Figure 33:
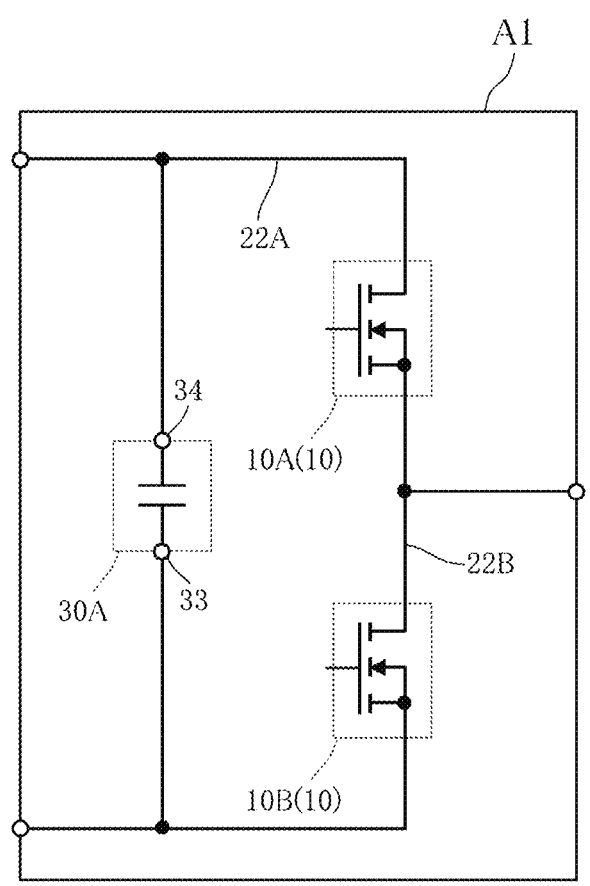
FIG. 33 is a schematic circuit diagram showing how the first switching element and the second switching element are connected in series to form a bridge.

The switching elements 10 include a plurality of switching elements 10A and a plurality of switching elements 10B. In the example shown in FIG. 6, the semiconductor device A1 has four switching elements 10A and four switching elements 10B. The numbers of the switching elements 10A and 10B are not limited to these, and may be changed as appropriate according to the performance required of the semiconductor device A1. The semiconductor device A1 may be a half-bridge switching circuit. In this case, in the semiconductor device A1, the switching elements 10A constitute an upper arm circuit, and the switching elements 10B constitute a lower arm circuit. As shown in FIG. 33, each switching element 10A and a relevant switching element 10B are connected in series to form a bridge.

The switching elements 10A are mounted on the supporting substrate 20, as shown in FIGS. 5, 6, 10 and 11. In the example shown in FIG. 5, the switching elements 10A are aligned in the y direction and spaced apart from each other. Each switching element 10A is bonded and electrically connected to the supporting substrate 20 (the conductive substrate 22A described later) via a conductive bonding material (not shown) (e.g., sintered metal such as sintered silver or copper, metal paste such as silver or copper paste, or solder). Each switching element 10A is bonded to the conductive substrate 22A, with the element reverse surface 102 opposing the conductive substrate 22A. Each switching element 10A is an example of "first switching element". In each switching element 10A, the first electrode 11 is an example of "first obverse electrode", the second electrode 12 is an example of "drive signal input electrode", and the third electrode 13 is an example of "first reverse electrode".

The switching elements 10B are mounted on the supporting substrate 20, as shown in FIGS. 5, 6, 10 and 11. In the example shown in FIG. 5, the switching elements 10B are aligned in the y direction and spaced apart from each other. Each switching element 10B is bonded and electrically connected to the supporting substrate 20 (the conductive substrate 22B described later) with a conductive bonding material (not shown) (e.g., sintered metal such as sintered silver or copper, metal paste such as silver or copper paste, or solder). Each switching element 10B is bonded to the conductive substrate 22B, with the element reverse surface 102 opposing the conductive substrate 22B. In the example shown in FIG. 5, the switching elements 10A and the switching elements 10B overlap with each other as viewed in the x direction, but the present disclosure is not limited to this. Each switching element 10B is an example of "second switching element". In each switching element 10B, the first electrode 11 is an example of "second obverse electrode", and the third electrode 13 is an example of "second reverse electrode".

The supporting substrate 20 supports the switching elements 10. The supporting substrate 20 includes a pair of insulating substrates 21A and 21B and a pair of conductive substrates 22A and 22B.

The insulating substrates 21A and 21B are electrically insulating. The material of the insulating substrates 21A and 21B may be a ceramic material with high thermal conductivity. Examples of such a ceramic material include aluminum nitride (AlN). The insulating substrates 21A and 21B are not limited to ceramic, and may be an insulating resin sheet, for example. The insulating substrates 21A and 21B may be rectangular in plan view. The insulating substrates 21A and 21B are aligned in the x direction and spaced apart from each other. The insulating substrate 21A is located on the x1 side of the insulating substrate 21B.

Each of the insulating substrates 21A and 21B has an obverse surface 211 and a reverse surface 212, as shown in FIG. 10. In each of the insulating substrates 21A and 21B, the obverse surface 211 and the reverse surface 212 are spaced apart from each other in the z direction. The obverse surface 211 faces in the z2 direction, and the reverse surface 212 faces in the z1 direction. The obverse surfaces 211 are covered with the resin member 60, along with the conductive substrates 22A and 22B and the switching elements 10.

The reverse surfaces 212 are exposed from the resin member 60 (the resin reverse surface 62 described later), as shown in FIG. 8. A heat sink (not shown) may be connected to the reverse surfaces 212.

Each of the conductive substrates 22A and 22B is a metal plate. The material of the metal plate may be copper (Cu) or a copper alloy. The conductive substrates 22A and 22B, along with the two input terminals 41 and 42 and the output terminal 43, form a conduction path to the switching elements 10. The conductive substrates 22A and 22B may be plated with silver. The conductive substrates 22A and 22B are spaced apart from each other in the x direction. In the example shown in FIGS. 5 and 10, the conductive substrate 22A is located on the x1 side of the conductive substrate 22B.

Each of the conductive substrates 22A and 22B has an obverse surface 221 and a reverse surface 222, as shown in FIG. 10. In each of the conductive substrates 22A and 22B, the obverse surface 221 and the reverse surface 222 are spaced apart from each other in the z direction. The obverse surface 221 faces in the z2 direction, and the reverse surface 222 faces in the z1 direction.

As shown in FIG. 10, the conductive substrate 22A is bonded to the insulating substrate 21A with a bonding material (not shown). The bonding material may be either electrically conductive or insulating. The conductive substrate 22A is bonded to the insulating substrate 21A, with the reverse surface 222 of the conductive substrate 22A opposing the obverse surface 211 of the insulating substrate 21A. The switching elements 10A and the signal substrate 30A are mounted on the obverse surface 221 of the conductive substrate 22A. In the present embodiment, the conductive substrate 22A is an example of "first conductive member".

As shown in FIG. 10, the conductive substrate 22B is bonded to the insulating substrate 21B with a bonding material (not shown). The bonding material may be either electrically conductive or insulating. The conductive substrate 22B is bonded to the insulating substrate 21B, with the reverse surface 222 of the conductive substrate 22B opposing the obverse surface 211 of the insulating substrate 21B. The switching elements 10B and the signal substrate 30B are mounted on the obverse surface 221 of the conductive substrate 22B. In the present embodiment, the conductive substrate 22B is an example of "second conductive member".

The configuration of the supporting substrate 20 is not limited to the above example. For example, the two conductive substrates 22A and 22B may be bonded to a single insulating substrate. A metal layer may be formed on the reverse surface 222 of each of the insulating substrates 21A and 21B. The shape, size and arrangement of each of the insulating substrates 21A and 21B and the conductive substrates 22A and 22B may be changed as appropriate based on the number and arrangement of the switching elements 10.

The signal substrate 30A and the signal substrate 30B relay various signals between the switching elements 10 and the signal terminals 44A to 47A and 44B to 47B, respectively. The signal substrate 30A has a laminate of a plurality of conductor layers and a plurality of dielectric layers in its internal structure, thereby functioning as a capacitor. Thus, the signal substrate 30A is a capacitor built-in substrate. An example of the internal structure of the signal substrate 30A is described later. The signal substrate 30B does not have the function as a capacitor. The signal substrate 30B may be a single-layer printed board. The signal substrate 30A is an example of "capacitor".

As shown in FIGS. 10 and 11, each of the signal substrates 30A and 30B has a substrate obverse surface 301 and a substrate reverse surface 302. The substrate obverse surface 301 and the substrate reverse surface 302 are spaced apart from each other in the z direction. The substrate obverse surface 301 faces in the z2 direction, and the substrate reverse surface 302 faces in the z1 direction. As shown in FIG. 11, the signal substrate 30A further has a pair of substrate side surfaces 303 and 304. In the signal substrate 30A, the substrate side surfaces 303 and 304 are connected to both the substrate obverse surface 301 and the substrate reverse surface 302 and located between the substrate obverse surface 301 and the substrate reverse surface 302 in the z direction. The substrate side surfaces 303 and 304 are spaced apart from each other in the x direction. The substrate side surface 303 faces in the x1 direction, and the substrate side surface 304 faces in the x2 direction. The substrate obverse surface 301 is an example of "capacitor obverse surface", and the substrate reverse surface 302 is an example of "capacitor reverse surface". The substrate side surface 303 and substrate side surface 304 are an example of "first capacitor side surface" and an example of "second capacitor side surface", respectively.

As shown in FIGS. 5 and 10, the signal substrate 30A has a gate layer 31A and a detection layer 32A, and the signal substrate 30B has a gate layer 31B and a detection layer 32B.

The pair of gate layers 31A and 31B are electrically conductive and may be made of Cu or a Cu alloy. As shown in FIG. 5, each of the gate layers 31A and 31B is in the form of a strip elongated in the y direction. As shown in FIG. 10, the gate layer 31A is formed on the substrate obverse surface 301 of the signal substrate 30A. The gate layer 31A is electrically connected to the second electrode 12 (gate electrode) of each switching element 10A via a connector 50 (a gate wire 51 described later). The gate layer 31A receives a drive signal that controls the switching operation of each switching element 10A. As shown in FIG. 10, the gate layer 31B is formed on the substrate obverse surface 301 of the signal substrate 30B. The gate layer 31B is electrically connected to the second electrode 12 (gate electrode) of each switching element 10B via a connector 50 (a gate wire 51 described later). The gate layer 31B receives a drive signal that controls the switching operation of each switching element 10B. The gate layer 31A is an example of "wiring layer".

The pair of detection layers 32A and 32B are electrically conductive and may be made of Cu or a Cu alloy. As shown in FIG. 5, each of the detection layers 32A and 32B is in the form of a strip elongated in the y direction. As shown in FIGS. 10 and 11, the detection layer 32A is formed, along with the gate layer 31A, on the substrate obverse surface 301 of the signal substrate 30A. In plan view, the detection layer 32A is adjacent to the gate layer 31A and spaced apart from the gate layer 31A. In the example shown in FIG. 5, the detection layer 32A is located closer to the switching elements 10A than is the gate layer 31A in the x direction. The detection layer 32A is located on the x2 side of the gate layer 31A. The arrangement of the gate layer 31A and the detection layer 32A in the x direction may be reversed. The detection layer 32A is electrically connected to the first electrode 11 (source electrode) of each switching element 10A via a connector 50 (a gate wire 52 described later). As shown in FIG. 10, the detection layer 32B is formed, along with the gate layer 31B, on the substrate obverse surface 301 of the signal substrate 30B. In plan view, the detection layer 32B is adjacent to the gate layer 31B and spaced apart from the gate layer 31B. In the example shown in FIG. 5, the detection layer 32B is located closer to the switching elements 10B than is the gate layer 31B in the x direction. The detection layer 32B is located on the x1 side of the gate layer 31B. The arrangement of the gate layer 31B and the detection layer 32B in the x direction may be reversed. The detection layer 32B is electrically connected to the first electrode 11 (source electrode) of each switching element 10B via a connector 50 (a gate wire 52 described later).

As shown in FIGS. 10 and 11, the signal substrate 30A further includes a pair of connection terminals 33 and 34 and an insulating film 39. Applying a DC voltage across the connection terminals 33 and 34 allows the signal substrate 30A to store electric charge. The signal substrate 30A thus functions as a capacitor with the connection terminals 33 and 34 as external terminals. Preferably, the signal substrate 30A is designed to have a capacitance greater than twice the capacity of output when a DC voltage is applied to each switching element 10A or each switching element 10B. The signal substrate 30A may be 8 mm in dimension in the x direction, 27 mm in dimension in the y direction, and 2.25 mm in dimension in the z direction. Preferably, the dimension of the signal substrate 30A in the z direction is 5 mm or less. The dimensions of the signal substrate 30A are not limited to the above example. Preferably, the parasitic resistance of the signal substrate 30A is 1Ω or lower.

As shown in FIGS. 10 to 12, the connection terminal 33 is formed over the substrate obverse surface 301 and the substrate side surface 303 of the signal substrate 30A. The connection terminal 33 may be made of Cu, but is not limited to this. As shown in FIGS. 10 to 12, the connection terminal 33 includes an obverse electrode part 331 and a side electrode part 332. The obverse electrode part 331 is formed on the substrate obverse surface 301. The side electrode part 332 is formed on the substrate side surface 303. The side electrode part 332 does not cover the entirety of the substrate side surface 303, and the substrate side surface 303 is exposed from the side electrode part 332 at a portion near the edge on the z1 side. The side electrode part 332 is an example of "first side electrode part". As shown in FIG. 13, the signal substrate 30A has two edges spaced apart from each other in the y direction, i.e. a first-directional side (y1-side) edge and a second-directional side (y2-side) edge. The obverse electrode part 331, the gate layer 31A, and the detection layer 32A are each spaced apart from the first-directional side edge of the signal substrate 30A by a predetermined distance. (Specifically, the obverse electrode part 331 may have an edge opposing the first-directional side edge of the signal substrate 30A in plan view, and this edge is spaced apart from the first-directional side edge of the signal substrate 30A by a predetermined distance. The gate layer 31A and the detection layer 32A have the same configuration.) In the illustrated example, the separation distances dy1 of the obverse electrode part 331, the gate layer 31A and the detection layer 32A from the first-directional side edge are substantially the same, but the present disclosure is not limited to this. Similarly, each of the obverse electrode part 331, the gate layer 31A and the detection layer 32A is spaced apart from the second-directional side edge of the signal substrate 30A by a predetermined distance. In the illustrated example, the separation distances dy2 of the obverse electrode part 331, the gate layer 31A and the detection layer 32A from the second-directional side edge are substantially the same, but the present disclosure is not limited to this. Also, in the illustrated example, the separation distance dy1 and the separation distance dy2 are substantially the same. However, the present disclosure is not limited to this, and the separation distance dy1 and the separation distance dy2 may differ from each other.

As shown in FIGS. 10 and 11, the connection terminal 34 is formed over the substrate reverse surface 302 and the substrate side surface 304 of the signal substrate 30A. The connection terminal 34 may be made of Cu, but is not limited to this. As shown in FIGS. 10 and 11, the connection terminal 34 includes a reverse electrode part 341 and a side electrode part 342. The reverse electrode part 341 is formed on the substrate reverse surface 302. The side electrode part 342 is formed on the substrate side surface 304. The side electrode part 342 does not cover the entirety of the substrate side surface 304, and the substrate side surface 304 is exposed from the side electrode part 342 at a portion near the edge on the z2 side. As shown in FIGS. 10 and 11, the side electrode part 342 is bonded to the conductive substrate 22A with a conductive bonding material (not shown) (e.g., sintered metal, metal paste, or solder). The side electrode part 342 is an example of "second side electrode part".

As shown in FIGS. 10 to 12, the insulating film 39 covers the corner where the substrate reverse surface 302 and the substrate side surface 303 are connected. For example, the insulating film 39 covers the portion of the substrate side surface 303 that is exposed from the connection terminal 33 and the portion of the substrate reverse surface 302 that is exposed from the connection terminal 34. The insulating film 39 is provided to provide insulation between the connection terminal 33 and the conductive substrate 22A. The formation region of the insulating film 39 is not limited to the illustrated example. The insulating film 39 may be formed in other regions as long as it provides insulation between the connection terminal 33 and the conductive substrate 22A.

Each of the two input terminals 41 and 42 is a metal plate. The material of the metal plate is Cu or a Cu alloy. As shown in FIGS. 1 to 5, in the semiconductor device A1, the two input terminals 41 and 42 are offset in the x1 direction. A power supply voltage may be applied across the two input terminals 41 and 42. The input terminal 41 is the positive pole (P terminal), and the input terminal 42 is the negative pole (N terminal). The input terminal 41 and the input terminal 42 are spaced apart from each other. The input terminal 41 is an example of "first input terminal", and the input terminal 42 is an example of "second input terminal".

As shown in FIGS. 4 and 5, the input terminal 41 includes a pad portion 411 and a terminal portion 412.

The pad portion 411 is the portion of the input terminal 41 that is covered with the resin member 60. As shown in FIGS. 5 and 10, the pad portion 411 is bonded and electrically connected to the conductive substrate 22A via a conductive block 419. The pad portion 411 is bonded to the block 419 with a conductive bonding material (not shown), and the block 419 is bonded to the conductive substrate 22A with a conductive bonding material (not shown). Thus, the input terminal 41 and the conductive substrate 22A are electrically connected. The material of the block 419 is not particularly limited, and Cu, Cu alloys, CuMo (copper-molybdenum) composites, or CIC (Copper-Inver-Copper) composites may be used. The bonding between the pad portion 411 and the block 419 and the bonding between the block 419 and the conductive substrate 22A are not limited to the bonding using a conductive bonding material, and may be laser welding or ultrasonic bonding, for example. Also, the bonding between the pad portion 411 and the conductive substrate 22A is not limited to the bonding using a block 419.

The pad portion 411 may be partially bent and directly bonded to the conductive substrate 22A.

The terminal portion 412 is the portion of the input terminal 41 that is exposed from the resin member 60. As shown in FIG. 4, the terminal portion 412 extends from the resin member 60 in the x1 direction in plan view. The terminal portion 412 may be rectangular in plan view.

As shown in FIGS. 4 and 5, the input terminal 42 includes a pad portion 421 and a terminal portion 422.

The pad portion 421 is the portion of the input terminal 42 that is covered with the resin member 60. As shown in FIG. 4, the pad portion 421 has a coupling portion 421a, a plurality of extensions 421b and a connecting portion 421c.

As shown in FIG. 4, the coupling portion 421a may be in the form of a strip elongated in the y direction. As shown in FIGS. 5 and 10, the coupling portion 421a is bonded to the connection terminal 33 of the signal substrate 30A via a conductive block 428. The coupling portion 421a is bonded to the block 428 with a conductive bonding material (not shown), and the block 428 is bonded to the connection terminal 33 of the signal substrate 30A with a conductive bonding material (not shown). Thus, the input terminal 42 and the connection terminal 33 are electrically connected. The material of the block 428 is not particularly limited, and Cu, Cu alloys, CuMo (copper-molybdenum) composites, or CIC (Copper-Inver-Copper) composites may be used. The bonding between the coupling portion 421a and the block 428 and the bonding between the block 428 and the connection terminal 33 are not limited to the bonding using a conductive bonding material, and may be laser welding or ultrasonic bonding, for example.

As shown in FIG. 4, each of the extensions 421b is in the form of a strip extending from the coupling portion 421a in the x2 direction. Each extension 421b extends from the coupling portion 421a in the x direction to overlap with a relevant switching element 10B in plan view. The extensions 421b are arranged side by side in the y direction and spaced apart from each other. As shown in FIGS. 5 and 10, an end of each extension 421b is bonded to a relevant switching element 10B via a conductive block 429. As shown in FIGS. 10 and 11, the end of each extension 421b is bonded to a block 429 with a conductive bonding material (not shown), and the block 429 is bonded to the first electrode 11 of the relevant switching element 10B with a conductive bonding material (not shown). Thus, the input terminal 42 and the first electrode 11 of each switching element 10B are electrically connected. The material of the block 429 is not particularly limited, and Cu, Cu alloys, CuMo (copper-molybdenum) composites or CIC (Copper-Inver-Copper) composites may be used. The bonding between each extension 421b and a relevant block 429 and the bonding between each block 429 and a relevant first electrode 11 are not limited to the bonding using a conductive bonding material, and may be laser welding or ultrasonic bonding, for example. Also, the bonding between each extension 421b and the first electrode 11 of a relevant switching element 10B is not limited to the bonding using a block 429, and each extension 421b may be partially bent and directly bonded to the first electrode 11 of the relevant switching element 10B.

As shown in FIG. 4, the connecting portion 421c connects the coupling portion 421a and the terminal portion 422.

The terminal portion 422 is the portion of the input terminal 42 that is exposed from the resin member 60. As shown in FIG. 4, the terminal portion 422 extends from the resin member 60 in the x1 direction. As shown in FIG. 4, the terminal portion 422 is located on the y2 side of the terminal portion 412 of the input terminal 41 in plan view. The shape of the terminal portion 422 in plan view may be the same as that of the terminal portion 412.

The output terminal 43 is a metal plate. The material of the metal plate may be Cu or a Cu alloy. As shown in FIGS. 1 to 5, in the semiconductor device A1, the output terminal 43 is offset in the x2 direction. The AC power (voltage) converted by the switching elements 10 is output through the output terminal 43.

As shown in FIG. 4, the output terminal 43 includes a pad portion 431 and a terminal portion 432.

The pad portion 431 is the portion of the output terminal 43 that is covered with the resin member 60. As shown in FIGS. 5 and 10, the pad portion 431 is bonded and electrically connected to the conductive substrate 22B via a conductive block 439. As shown in FIG. 10, the pad portion 431 is bonded to the block 439 with a conductive bonding material (not shown), and the block 439 is bonded to the conductive substrate 22B with a conductive bonding material (not shown). Thus, the output terminal 43 and the conductive substrate 22B are electrically connected. The material of the block 439 is not particularly limited, and Cu, Cu alloys, CuMo composites, or CTC composites may be used. The bonding between the pad portion 431 and the block 439 and the bonding between the block 439 and the conductive substrate 22B are not limited to the bonding using a conductive bonding material, and may be laser welding or ultrasonic bonding, for example. Also, the bonding between the pad portion 431 and the conductive substrate 22B is not limited to the bonding via the block 439, and the pad portion 431 may be partially and directly bonded to the conductive substrate 22B.

The terminal portion 432 is the portion of the output terminal 43 that is exposed from the resin member 60. As shown in FIG. 4, the terminal portion 432 extends from the resin member 60 in the x2 direction. The terminal portion 432 may be rectangular in plan view.

The signal terminals 44A to 47A and 44B to 47B are terminals for inputting or outputting control signals for the semiconductor device A1. The control signals include signals for controlling the switching operation of the switching elements 10. The signal terminals 44A to 47A and 44B to 47B have the approximately same shape. Each of the signal terminals 44A to 47A and 44B to 47B is L-shaped as viewed in the x direction. As shown in FIGS. 1 to 8, the signal terminals 44A to 47A and 44B to 47B are arranged along the x direction. As shown in FIG. 9, the signal terminals 44A to 47A and 44B to 47B overlap with each other as viewed in the x direction. In plan view, the signal terminals 44A to 47A are adjacent to the conductive substrate 22A in the y direction, as shown in FIG. 5. In plan view, the signal terminals 44B to 47B are adjacent to the conductive substrate 22B in the y direction, as shown in FIG. 5. Each of the signal terminals 44A to 47A and 44B to 47B may project from the surface of the resin member 60 that faces in the y1 direction (the resin side surface 633 described later). The signal terminals 44A to 47A and 44B to 47B may be formed from the same lead frame.

As shown in FIGS. 5 and 6, the signal terminals 44A and 44B are electrically connected to the detection layers 32A and 32B, respectively, with connectors 50 (second connection wires 54 described later). The voltage applied to the first electrode 11 of each switching element 10A (voltage corresponding to the source current) is detected at the signal terminal 44A. The signal terminal 44A is the source-signal detection terminal for the switching elements 10A. The voltage applied to the first electrode 11 of each switching element 10B (voltage corresponding to the source current) is detected at the signal terminal 44B. The signal terminal 44B is the source-signal detection terminal for the switching elements 10B.

As shown in FIG. 6, each of the pair of signal terminals 44A and 44B includes a pad portion 441 and a terminal portion 442. In each of the signal terminals 44A and 44B, the pad portion 441 is covered with the resin member 60. Thus, the signal terminals 44A and 44B are supported by the resin member 60. The terminal portion 442 is connected to the pad portion 441 and exposed from the resin member 60. Each of the signal terminals 44A and 44B is bent at the terminal portion 442.

As shown in FIGS. 5 and 6, the signal terminals 45A and 45B are electrically connected to the gate layers 31A and 31B, respectively, with connectors 50 (first connection wires 53 described later). A drive signal (gate voltage) for driving the switching elements 10A is applied to the signal terminal 45A. The signal terminal 45A is the drive-signal input terminal (gate-signal input terminal) for the switching elements 10A. A drive signal (gate voltage) for driving the switching elements 10B is applied to the signal terminal 45B. The signal terminal 45B is the drive-signal input terminal (gate-signal input terminal) for the switching elements 10B.

As shown in FIG. 6, each of the pair of signal terminals 45A and 45B includes a pad portion 451 and a terminal portion 452. In each of the signal terminals 45A and 45B, the pad portion 451 is covered with the resin member 60. Thus, the signal terminals 45A and 45B are supported by the resin member 60. The terminal portion 452 is connected to the pad portion 451 and exposed from the resin member 60. Each of the signal terminals 45A and 45B is bent at the terminal portion 452.

As shown in FIGS. 5 and 6, the signal terminals 46A, 46B, 47A and 47B are not electrically connected to other constituent elements. The semiconductor device A1 may not be provided with these signal terminals 46A, 46B, 47A and 47B.

As shown in FIG. 6, each of the pair of signal terminals 46A and 46B includes a pad portion 461 and a terminal portion 462. In each of the signal terminals 46A and 46B, the pad portion 461 is covered with the resin member 60. Thus, the signal terminals 46A and 46B are supported by the resin member 60. The terminal portion 462 is connected to the pad portion 461 and exposed from the resin member 60. Each of the signal terminals 46A and 46B is bent at the terminal portion 462. Each of the pair of signal terminals 47A and 47B includes a pad portion 471 and a terminal portion 472. In each of the signal terminals 47A and 47B, the pad portion 471 is covered with the resin member 60. Thus, the signal terminals 47A and 47B are supported by the resin member 60. The terminal portion 472 is connected to the pad portion 471 and exposed from the resin member 60. Each of the signal terminals 47A and 47B is bent at the terminal portion 472.

Each of the connectors 50 electrically connects two elements that are separated from each other. As shown in FIG. 5, the connectors 50 include a plurality of gate wires 51, a plurality of detection wires 52, a pair of first connection wires 53, a pair of second connection wires 54, and a plurality of lead members 55.

Each of the gate wires 51, the detection wires 52, the first connection wires 53 and the connection wires 54 may be referred to as a "bonding wire" and may be made of Al (aluminum), Au (gold) or Cu.

As shown in FIGS. 5 and 6, each of the gate wires 51 has an end (first end) bonded to the second electrode 12 (gate electrode) of a switching element 10 and another end (second end) bonded to the gate layer 31A or 31B. The gate wires 51 include those electrically connecting the second electrodes 12 of the switching elements 10A and the gate layer 31A and those electrically connecting the second electrodes 12 of the switching elements 10B and the gate layer 31B.

As shown in FIGS. 5 and 6, each of the detection wires 52 has an end bonded to the first electrode 11 (source electrode) of a switching element 10 and another end bonded to the detection layer 32A or 32B. The detection wires 52 include those electrically connecting the first electrode 11 of the switching elements 10A and the detection layer 32A and those electrically connecting the first electrodes 11 of the switching elements 10B and the gate layer 32B.

As shown in FIGS. 5 and 6, one of the pair of first connection wires 53 connects the gate layer 31A and the signal terminal 45A (gate-signal input terminal), and the other one connects the gate layer 31B and the signal terminal 45B (gate-signal input terminal). Specifically, one of the first connection wires 53 is bonded to the gate layer 31A at one end thereof and bonded to the pad portion 451 of the signal terminal 45A at the other end thereof. The other first connection wire 53 is bonded to the gate layer 31B at one end thereof and bonded to the pad portion 451 of the signal terminal 45B at the other end thereof.

As shown in FIGS. 5 and 6, one of the pair of second connection wires 54 connects the detection layer 32A and the signal terminal 44A (source-signal detection terminal), and the other one connects the detection layer 32B and the signal terminal 44B (source-signal detection terminal). Specifically, one of the second connection wires 54 is bonded to the detection layer 32A at one end thereof and bonded to the pad portion 441 of the signal terminal 44A at the other end thereof. The other second connection wire 54 is bonded to the detection layer 32B at one end thereof and bonded to the pad portion 441 of the signal terminal 44B at the other end thereof.

The lead members 55 are made of a conductive material, which may be Al, Au or Cu. In the semiconductor device A1, a bonding wire may be used instead of each lead member 55. As shown in FIGS. 5, 6 and 11, each of the lead members 55 electrically connects the first electrode 11 of a switching element 10A and the conductive substrate 22B. As shown in FIGS. 5 and 6, each lead member 55 is in the form of a strip elongated in the x direction in plan view. Each lead member 55 is an example of "connector".

As shown in FIGS. 6, 10 and 11, each lead member 55 has a first bond portion 551, a second bond portion 552 and an intermediate portion 553. The first bond portion 551 is the portion of each lead member 55 that is bonded to a switching element 10A. The first bond portion 551 is bonded to the first electrode 11 of a switching element 10 with a conductive bonding material (not shown). The first bond portion 551 overlaps with the first electrode 11 of a switching element 10A in plan view. The second bond portion 552 is the portion of each lead member 55 that is bonded to the conductive substrate 22B. The second bond portion 552 is bonded to the obverse surface 221 of the conductive substrate 22B with a conductive bonding material (not shown). The second bond portion 552 may be directly bonded to the conductive substrate 22B by laser welding or ultrasonic welding. The second bond portion 552 overlaps with the conductive substrate 22B in plan view. The thickness (dimension in the z direction) of the second bond portion 552 is larger than the thickness (dimension in the z direction) of the first bond portion 551. The intermediate portion 553 is the portion of each lead member 55 that is connected to the first bond portion 551 and the second bond portion 552. The thickness (dimension in the z direction) of the intermediate portion 553 is substantially the same as the thickness (dimension in the z direction) of the first bond portion 551. The intermediate portion 553 extends over the conductive substrate 22A and the conductive substrate 22B in plan view.

As shown in FIGS. 4, 5 and 10, the resin member 60 covers the switching elements 10, the supporting substrate 20 (excluding the reverse surfaces 212 of the insulating substrates 21A and 21B), the signal substrates 30A and 30B, portions of the terminals 41 to 43, 44A to 47A and 44B to 47B, and the connectors 50. The resin member 60 may be made of an epoxy resin. As shown in FIGS. 4, 5 and 10, the resin member 60 has a resin obverse surface 61, a resin reverse surface 62 and a plurality of resin side surfaces 631 to 634.

As shown in FIG. 10, the resin obverse surface 61 and the resin reverse surface 62 are spaced apart from each other in the z direction. The resin obverse surface 61 faces in the z2 direction, and the resin reverse surface 62 faces in the z1 direction. As shown in FIG. 8, the resin reverse surface 62 has the shape of a frame surrounding the reverse surfaces 212 of the insulating substrates 21A and 21B in plan view. The reverse surfaces 212 of the insulating substrates 21A and 21B are exposed from the resin reverse surface 62. The resin side surfaces 631 to 634 are connected to both the resin obverse surface 61 and the resin reverse surface 62 and located between these in the z direction. The resin side surface 631 and the resin side surface 632 are spaced apart from each other in the x direction. The resin side surface 631 faces in the x1 direction, and the resin side surface 632 faces in the x2 direction. The two input terminals 41 and 42 project from the resin side surface 631, and the output terminal 43 projects from the resin side surface 632. The resin side surface 633 and the resin side surface 634 are spaced apart from each other in the y direction. The resin side surface 633 faces in the y1 direction, and the resin side surface 634 faces in the y2 direction. The signal terminals 44A to 47A and 44B to 47B project from the resin side surface 633.

As shown in FIGS. 8 and 10, the resin member 60 has a recess 65 that is recessed from the resin reverse surface 62 in the z direction. As shown in FIG. 8, the recess 65 is in the form of a loop surrounding the supporting substrate 20 in plan view. Alternatively, the resin member 60 may not be formed with the recess 65.

An example of the internal structure of the signal substrate 30A is described below with reference to FIGS. 15 to 18. The signal substrate 30A includes, in its internal structure, a plurality of first conductor layers 361, a plurality of second conductor layers 362, a plurality of dielectric layers 37, and a plurality of insulating layers 38, which are laminated in a predetermined order in the z direction.

Figure 15:
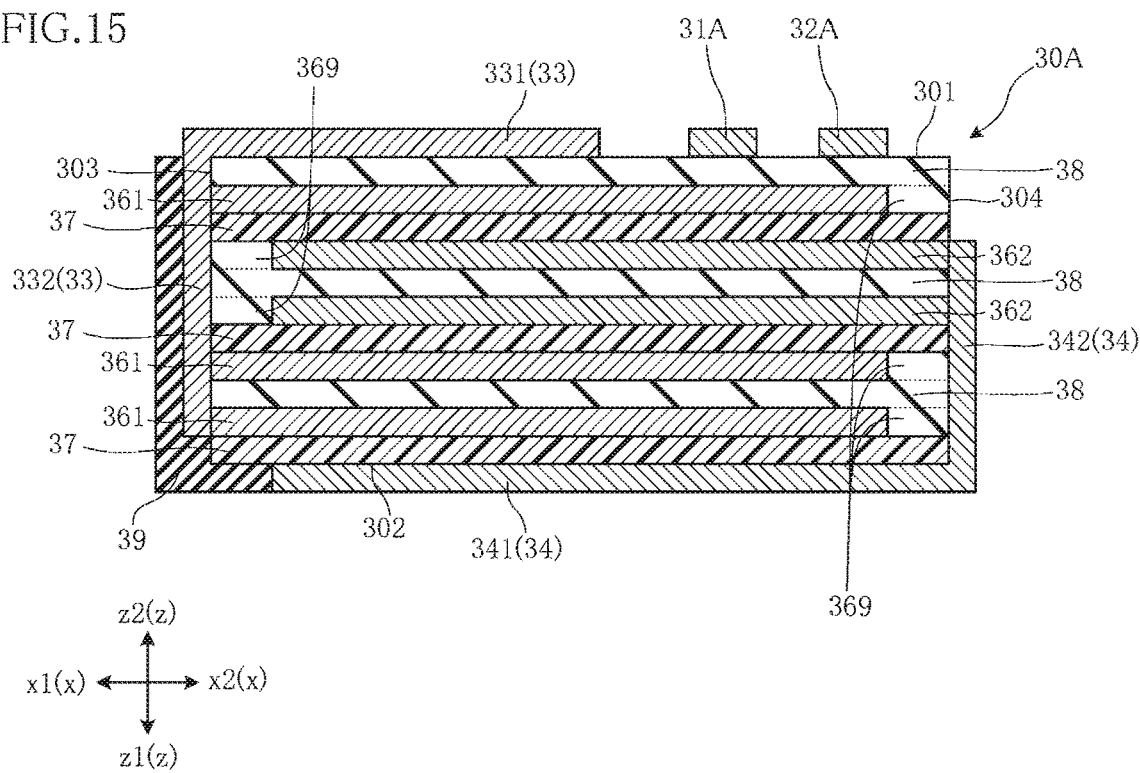
FIG. 15 is a sectional view taken along line XV-XV in FIG. 13.
Figure 16:
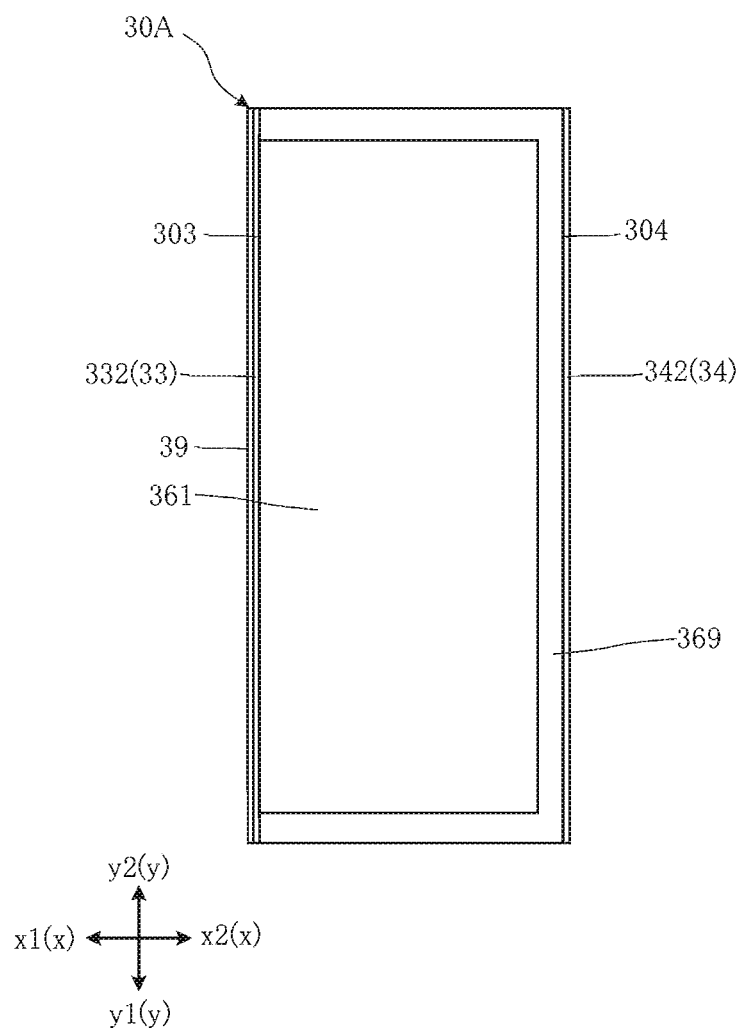
FIG. 16 is a plan view showing a conductor layer of the signal substrate.
Figure 17:
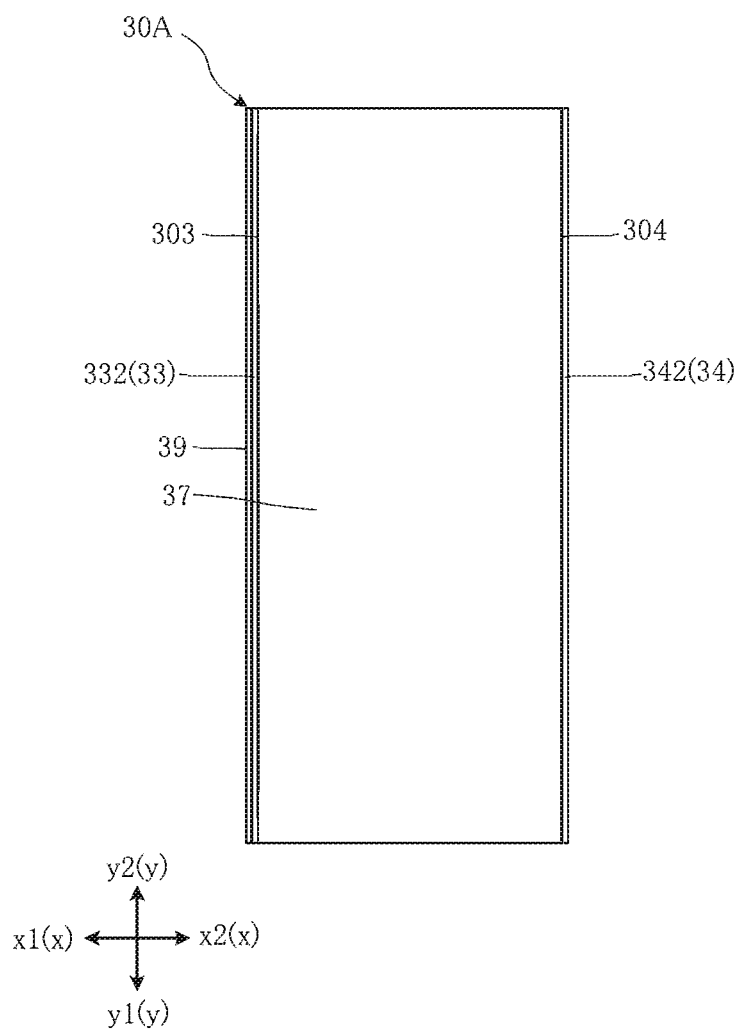
FIG. 17 is a plan view showing a dielectric layer of the signal substrate.
Figure 18:
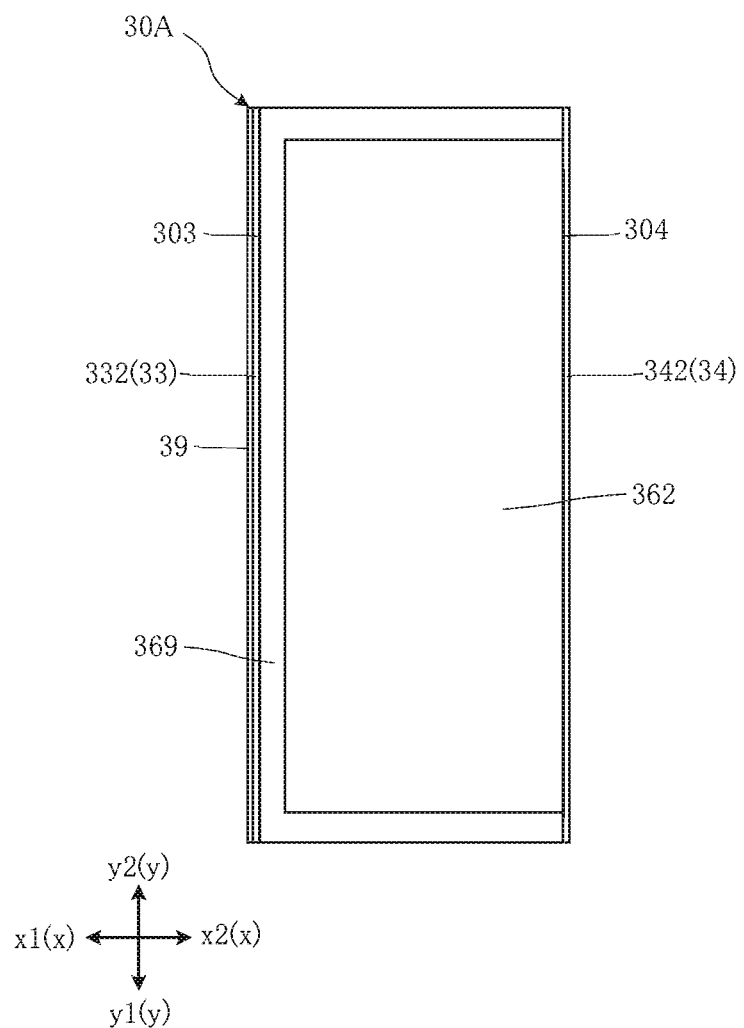
FIG. 18 is a plan view showing a conductor layer of the signal substrate.

FIG. 15 is a sectional view taken along line XV-XV in FIG. 13. FIG. 16 is a plan view showing an example of each first conductor layer 361. FIG. 17 is a plan view showing an example of each dielectric layer 37. FIG. 18 is a plan view showing an example of each second conductor layer 362.

The first conductor layers 361 and the second conductor layers 362 may be made of Cu. The dielectric layers 37 may be made of a resin material. The material of the dielectric layers 37 is not limited to a resin material, and insulators with a relative permittivity greater than 1, such as ceramic, may be used. The insulating layers 38 may be made of prepreg and have a lower dielectric strength than the dielectric layers 37.

As shown in FIGS. 15 and 16, each of the first conductor layers 361 is in contact with the connection terminal 33 (side electrode part 332) formed on the substrate side surface 303. The first conductor layers 361 overlap with each other in plan view. The first conductor layers 361 are electrically connected to each other via the side electrode part 332. The first conductor layers 361 are spaced apart from the connection terminal 34. As shown in FIG. 16, an insulator 369 is formed around each of the first conductor layers 361 (except the side connected to the connection terminal 33) in plan view. The insulator 369 may be made of prepreg, as with the insulating layers 38.

As shown in FIGS. 15 and 18, each of the second conductor layers 362 is in contact with the connection terminal 34 (side electrode part 342) formed on the substrate side surface 304. The second conductor layers 362 overlap with each other in plan view. The second conductor layers 362 are electrically connected to each other via the side electrode part 342. The second conductor layers 362 are spaced apart from the connection terminal 33. As shown in FIG. 18, an insulator 369 is formed around each of the second conductor layers 362 (except the side connected to the connection terminal 34) in plan view.

The first conductor layer 361 positioned furthest in the z2 direction among the plurality of first conductor layers 361 is a surface layer of the signal substrate 30A on the z2 side, and the obverse electrode part 331 is formed on the surface of this first conductor layer 361. This first conductor layer 361 and the obverse electrode part 331 may have substantially the same shape in plan view. The second conductor layer 362 positioned furthest in the z1 direction among the plurality of second conductor layers 362 is a surface layer of the signal substrate 30A on the z1 side, and the reverse electrode part 341 is formed on the surface of this second conductor layer 362. This second conductor layer 362 and the reverse electrode part 341 may have substantially the same shape in plan view.

In the example shown in FIG. 15, each of the dielectric layers 37 (excluding the lowermost dielectric layer 37) is sandwiched between a relevant first conductor layer 361 and a relevant second conductor layer 362 in the z direction and in contact with both the side electrode part 332 and the side electrode part 342 (see also FIG. 17). The lowermost dielectric layer 37 is sandwiched between a relevant first conductor layer 361 (the lowermost first conductor layer 361) and the reverse electrode part 341 in the z direction and at least in contact with the side electrode part 342. As shown in FIG. 17, each dielectric layer 37 (including the lowermost first conductor layer 361) extends from the edge on the y1 side to the edge on the y2 side of the signal substrate 30A. The dimension of each dielectric layer 37 in the z direction may be about 8 μm to 20 μm, but the present disclosure is not limited to this.

The plurality of insulating layers 38 include one sandwiched between two first conductor layers 361 between two dielectric layers 37 that are adjacent in the z direction (i.e., the third insulating layer 38 from the substrate obverse surface 301 side in the example of FIG. 15), and one sandwiched between two second conductor layers 362 between two dielectric layers 37 that are adjacent in the z direction (i.e., the second insulating layer 38 from the substrate obverse surface 301 side in the example of FIG. 15). Each insulating layer 38 also functions as an adhesive layer for the two first conductor layers 361 or the two second conductor layers 362 that are in contact with opposite sides of the insulating layer in the z direction. Each insulating layer 38 overlaps with the plurality of first conductor layers 361, the plurality of second conductor layers 362, and the plurality of dielectric layers 37 in plan view. In a configuration of the signal substrate 30A different from the illustrated one, the insulating layers 38 and the insulating films 39 may be integrally formed.

The insulating layer 38 positioned furthest in the z2 direction among the plurality of insulating layers 38 is a surface layer of the signal substrate 30A on the z2 side, and the obverse electrode part 331 is formed on the surface of this insulating layer 38. In the signal substrate 30A, because the gate layer 31A and the detection layer 32A are formed on the substrate obverse surface 301, the surface layer on the z2 side is configured as an insulating layer 38. The dielectric layer 37 positioned furthest in the z1 direction among the plurality of dielectric layers 37 is a surface layer of the signal substrate 30A on the z1 side, and the reverse electrode part 341 is formed on the surface of this dielectric layer 37.

In the signal substrate 30A, when a potential difference is produced between the first conductor layers 361 and the second conductor layers 362 by the application of voltage across the connection terminal 33 and the connection terminal 34, a voltage is applied to each dielectric layer 37, allowing electric charge to be accumulated on the first conductor layers 361 and the second conductor layers 362. Thus, the signal substrate 30A functions as a capacitor, with the first conductor layers 361 and the second conductor layers 362 arranged on either side of the dielectric layers 37 serving as electrode plates. In the present embodiment, as shown in FIG. 15, a dielectric layer 37 is disposed between the reverse electrode part 341 and the first conductor layer 361 positioned furthest in the z1 direction among the plurality of first conductor layers 361. Thus, the reverse electrode part 341 functions as an electrode plate of the capacitor, as with the second conductor layer 362. In this way, in the signal substrate 30A, the reverse electrode part 341 functions as an external terminal and also as an electrode plate of the capacitor.

The internal structure of the signal substrate 30A is not limited to the above example, and the structure of a known multilayer capacitor (e.g., multilayer ceramic capacitor) may be employed. In the signal substrate 30A, the number of the laminated layers (the first conductor layers 361, the second conductor layers 362, the dielectric layers 37 and the insulating layers 38) is not limited to the example shown in FIG. 15, and may be changed as appropriate based on the performance (e.g., capacitance) of the signal substrate 30A as a capacitor. Also, the size and material of each layer are not limited to the above example.

The effect and advantages of the semiconductor device A1 configured as above are as follows.

The semiconductor device A1 has the signal substrate 30A. The signal substrate 30A has a pair of connection terminals 33 and 34 and functions as a capacitor with the connection terminals 33 and 34 as electrodes. A switching element 10A and a switching element 10B are connected in series to form a bridge. The connection terminal 33 and the connection terminal 34 are electrically connected to the opposite ends of the bridge. With such a configuration, the semiconductor device A1 is provided with the signal substrate 30A functioning as a capacitor and forms the path of current through the capacitor (signal substrate 30A) and the switching elements 10A and 10B. Accordingly, as compared with a structure without the signal substrate 30A, the semiconductor device A1 can reduce the internal inductance, thereby reducing the surge voltage applied to each of the switching elements 10A and 10B.

In the semiconductor device A1, each of the switching elements 10A and 10B has a first electrode 11 and a third electrode 13. When each of the switching elements 10A and 10B is a MOSFET, the first electrode 11 is a source electrode, and the third electrode 13 is a drain electrode. The connection terminal 34 of the signal substrate 30A (capacitor) is electrically connected to the third electrode 13 of each switching element 10A via the conductive substrate 22A. The first electrode 11 of each switching element 10A is electrically connected to the third electrode 13 of a relevant switching element 10B via a lead member 55 and the conductive substrate 22B. The third electrode 13 of each switching element 10B is electrically connected to the connection terminal 33 of the signal substrate 30A (capacitor) via the input terminal 42 (pad portion 421) and the block 428. Such a configuration forms the path of current (see the bold arrow in FIG. 11) from the signal substrate 30A (connection terminal 34), through the conductive substrate 22A, each switching element 10A (from the third electrode 13 to the first electrode 11), each lead member 55, the conductive substrate 22B, each switching element 10B (from the third electrode 13 to the first electrode 11), and the input terminal 42 (extensions 421b) in that order, and back to the signal substrate 30A (connection terminal 33). Forming such a current path can reduce the internal inductance of the semiconductor device A1. Preferably, according to this current path, the internal inductance of semiconductor device A1 can be made as 10 nH or less.

In the semiconductor device A1, the signal substrate 30A (capacitor) is bonded to the conductive substrate 22A, along with the switching elements 10A. With such a configuration, the heat generated by the signal substrate 30A during the energization of the semiconductor device A1 is dissipated to the conductive substrate 22A, and discharged to the outside through the conductive substrate 22A and the insulating substrate 21A. Because the switching elements 10A are also bonded to the conductive substrate 22A, the heat generated by the switching elements 10A is also dissipated to the conductive substrate 22A, and discharged to the outside through the conductive substrate 22A and the insulating substrate 21A, That is, the heat dissipation path of the signal substrate 30A is the same as that of the switching elements 10A. Thus, the semiconductor device A1 can improve the heat dissipation of the signal substrate 30A.

In the semiconductor device A1, the signal substrate 30A has the connection terminal 33 and the gate layer 31A that are formed on the substrate obverse surface 301. The signal substrate 30A also has the connection terminal 34 formed on the substrate reverse surface 302. With such a configuration, the signal substrate 30A, which relays signals such as drive signals, functions as a capacitor. In a semiconductor device different from the semiconductor device A1, a capacitor element may be connected across the two input terminals 41 and 42. Such a configuration can increase the thickness of the resin member 60, because the capacitor element is mounted on the input terminals 41 and 42. In contrast, the semiconductor device A1 can reduce the thickness of the resin member 60 and hence prevent an increase in size of the semiconductor device A1.

In the semiconductor device A1, the dielectric layers 37 of the signal substrate 30A may be made of a resin material. Some known multilayer capacitors use ceramic for the dielectric layers. Using ceramic for the dielectric layers may cause a concern about reduced reliability due to cracking, for example. The dielectric layers 37 of the present disclosure, having the above configuration, can reduce cracking and hence have a higher reliability than dielectric layers made of ceramic.

In the semiconductor device A1, each dielectric layer 37 of the signal substrate 30A is sandwiched between two conductor layers with different potentials (a first conductor layer 361 and a second conductor layer 362), and each insulating layer 38 is sandwiched between two conductor layers with the same potential (two first conductor layers 361 or two second conductor layers 362). Thus, when a potential difference is produced between the first conductor layers 361 and the second conductor layers 362 by application of voltage across the connection terminal 33 and the connection terminal 34, a voltage is applied to the dielectric layers 37 in the thickness direction (z direction), but is not applied to the insulating layers 38 in the thickness direction (z direction). Thus, it is not necessary to guarantee the withstand voltage (dielectric strength) of the insulating layers 38. That is, the signal substrate 30A of the semiconductor device A1 can prevent reduction of the dielectric strength.

Figure 19:
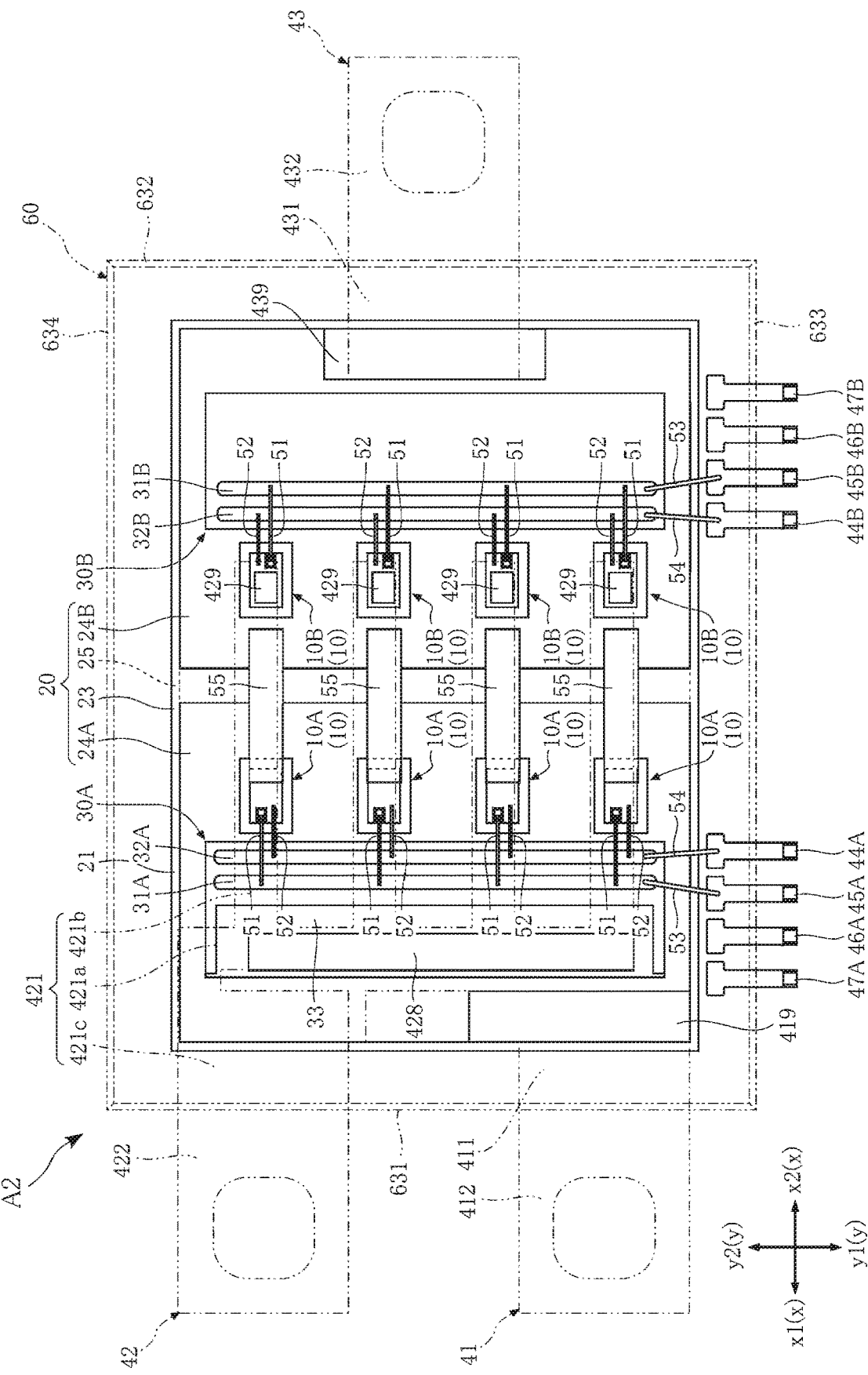
FIG. 19 is a plan view of a semiconductor device according to a second embodiment, in which two input terminals, an output terminal and a resin member are shown by imaginary lines.
Figure 20:
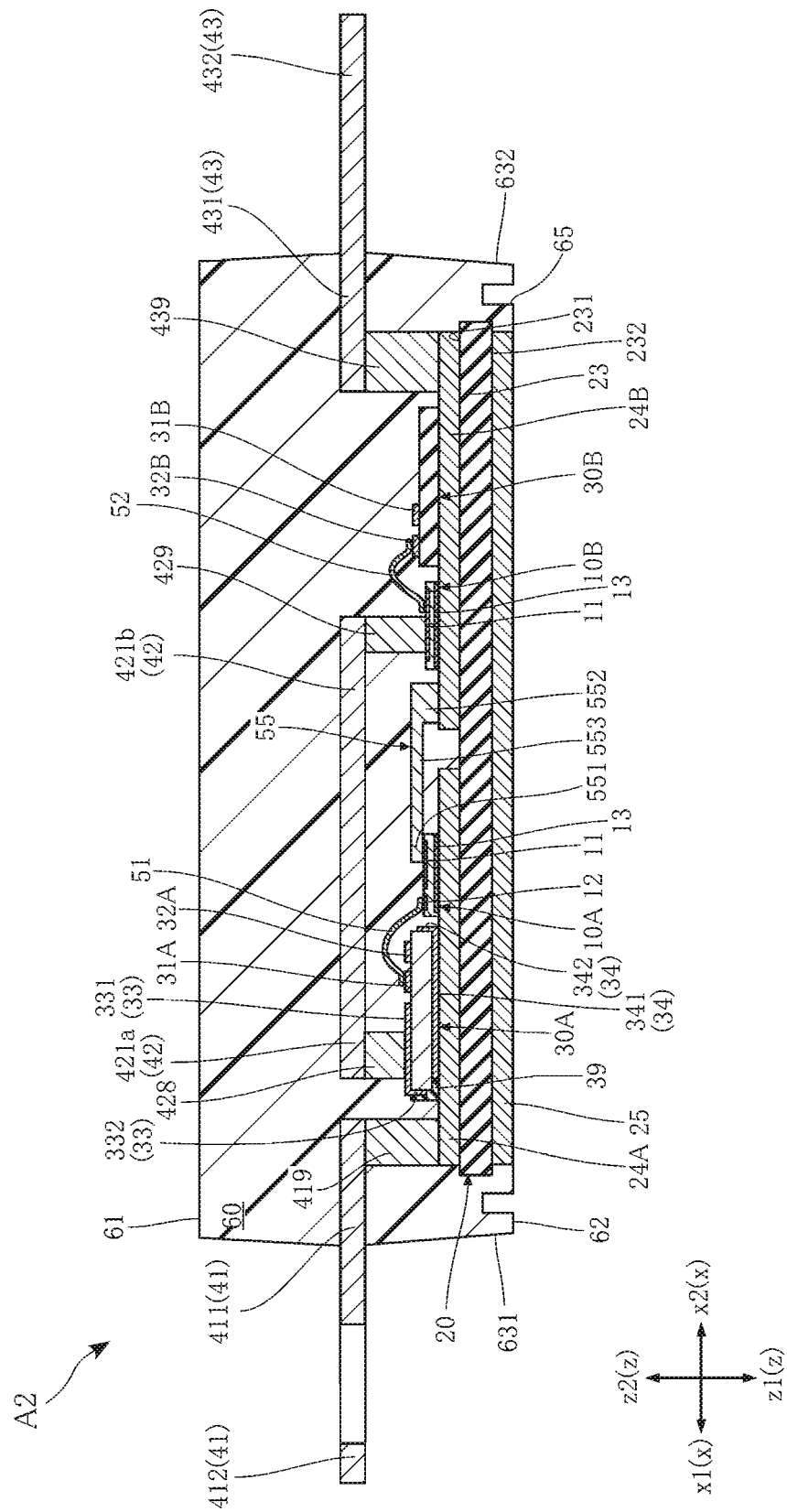
FIG. 20 is a sectional view of the semiconductor device according to the second embodiment.

FIGS. 19 and 20 show a semiconductor device A2 according to a second embodiment. FIG. 19 is a plan view of the semiconductor device A2. In FIG. 19, the two input terminals 41 and 42, the output terminal 43 and the resin member 60 are shown by imaginary lines (two-dot chain lines). FIG. 20 is a sectional view of the semiconductor device A2, taken along the same plane as FIG. 10 of the semiconductor device A1.

As shown in FIGS. 19 and 20, the semiconductor device A2 differs from the semiconductor device A1 in structure of the supporting substrate 20. The supporting substrate 20 of the semiconductor device A2 is a DBC (Direct Bonded Copper) substrate. The supporting substrate 20 may be a DBA (Direct Bonded Aluminum) substrate instead of a DBC substrate. The supporting substrate 20 includes an insulating substrate 23, a pair of obverse metal layers 24A and 24B, and a reverse metal layer 25.

As with the insulating substrates 21A and 21B, the insulating substrate 23 may be made of a ceramic material with high thermal conductivity. The insulating substrate 23 may be rectangular in plan view. The insulating substrate 23 has an obverse surface 231 and a reverse surface 232. The obverse surface 231 and the reverse surface 232 are spaced apart from each other in the z direction. The obverse surface 231 faces in the z2 direction, and the reverse surface 232 faces in the z1 direction.

As shown in FIG. 20, the obverse metal layers 24A and 24B are formed on the obverse surface 231 of the insulating substrate 23. The obverse metal layers 24A and 24B may be made of Cu. The obverse metal layers may be made of Al instead of Cu. The obverse metal layers 24A and 24B are spaced apart from each other in the x direction. The obverse metal layer 24A is located on the x1 side of the obverse metal layer 24B. As with the conductive substrate 22A, the switching elements 10A and the signal substrate 30A are mounted on the obverse metal layer 24A. As with the conductive substrate 22B, the switching elements 10B and the signal substrate 30B are mounted on the obverse metal layer 24B. The obverse metal layers 24A and 24B are thinner than the conductive substrates 22A and 22B, respectively. In the present embodiment, the obverse metal layer 24A is an example of "first conductive member", and the obverse metal layer 24B is an example of "second conductive member".

The reverse metal layer 25 is formed on the reverse surface 232 of the insulating substrate 23. The reverse metal layer 25 is made of the same material as the obverse metal layers 24A and 24B. The reverse metal layer 25 may be covered with the resin member 60 or its surface facing in the z1 direction may be exposed from the resin member 60 (resin reverse surface 62).

The configuration of the supporting substrate 20 is not limited to the above example. For example, instead of the single insulating substrate 23, the insulating substrate may be divided for each of the obverse metal layers 24A and 24B. That is, as with the semiconductor device A1, two separate insulating substrates may be provided, on each of which one of the obverse metal layers 24A and 24B may be formed. Also, instead of the single reverse metal layer 25, the reverse metal layer may be divided into two. In this case, the two reverse metal layers are spaced apart from each other in the x direction, each overlapping with a relevant one of the obverse metal layers 24A and 24B. The conductive substrates 22A and 22B described above may be mounted on the obverse metal layers 24A and 24B, respectively.

The semiconductor device A2 has the same advantages as the semiconductor device A1.

Figure 21:
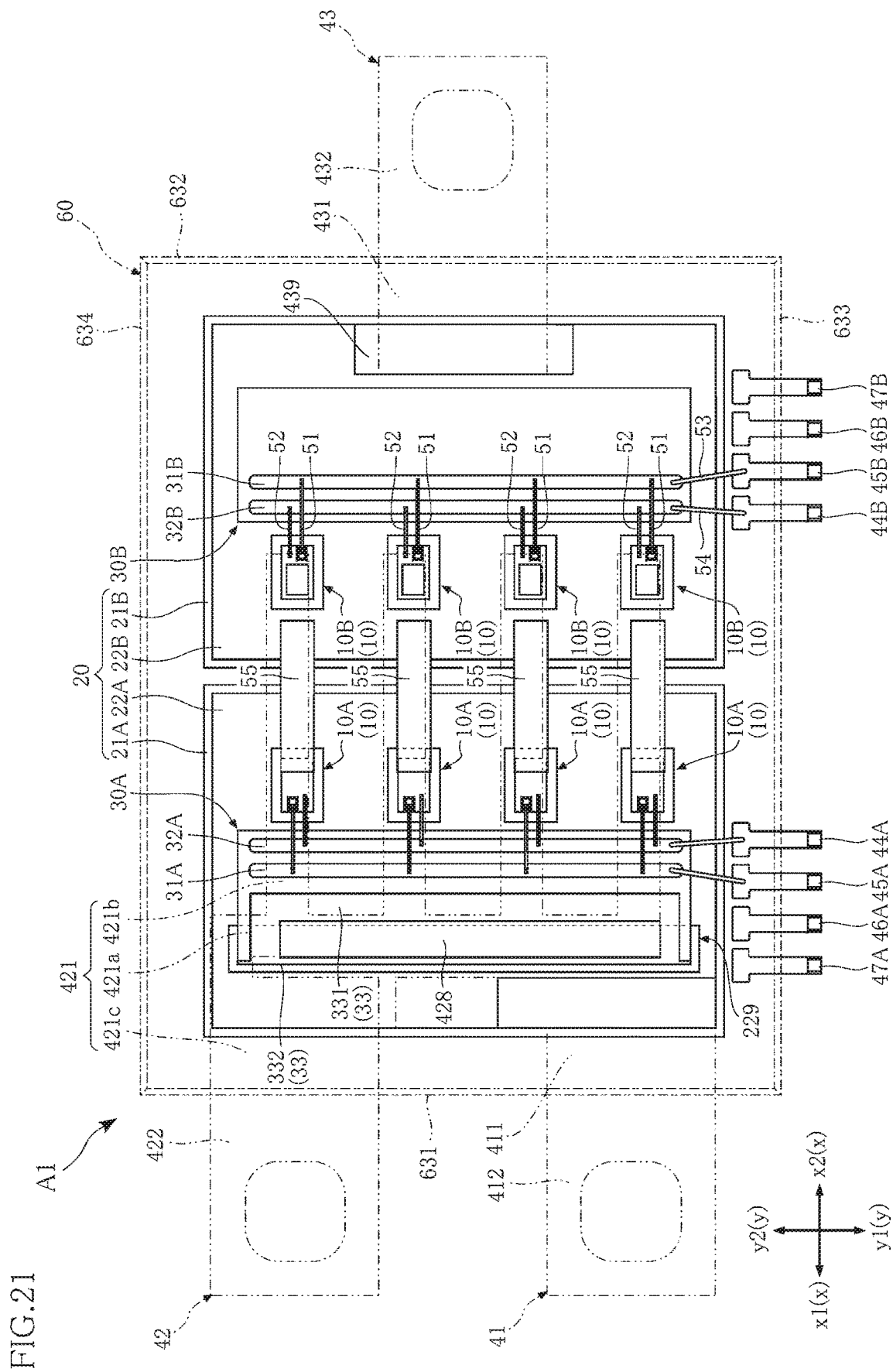
FIG. 21 is a plan view of a semiconductor device according to a variation.
Figure 22:
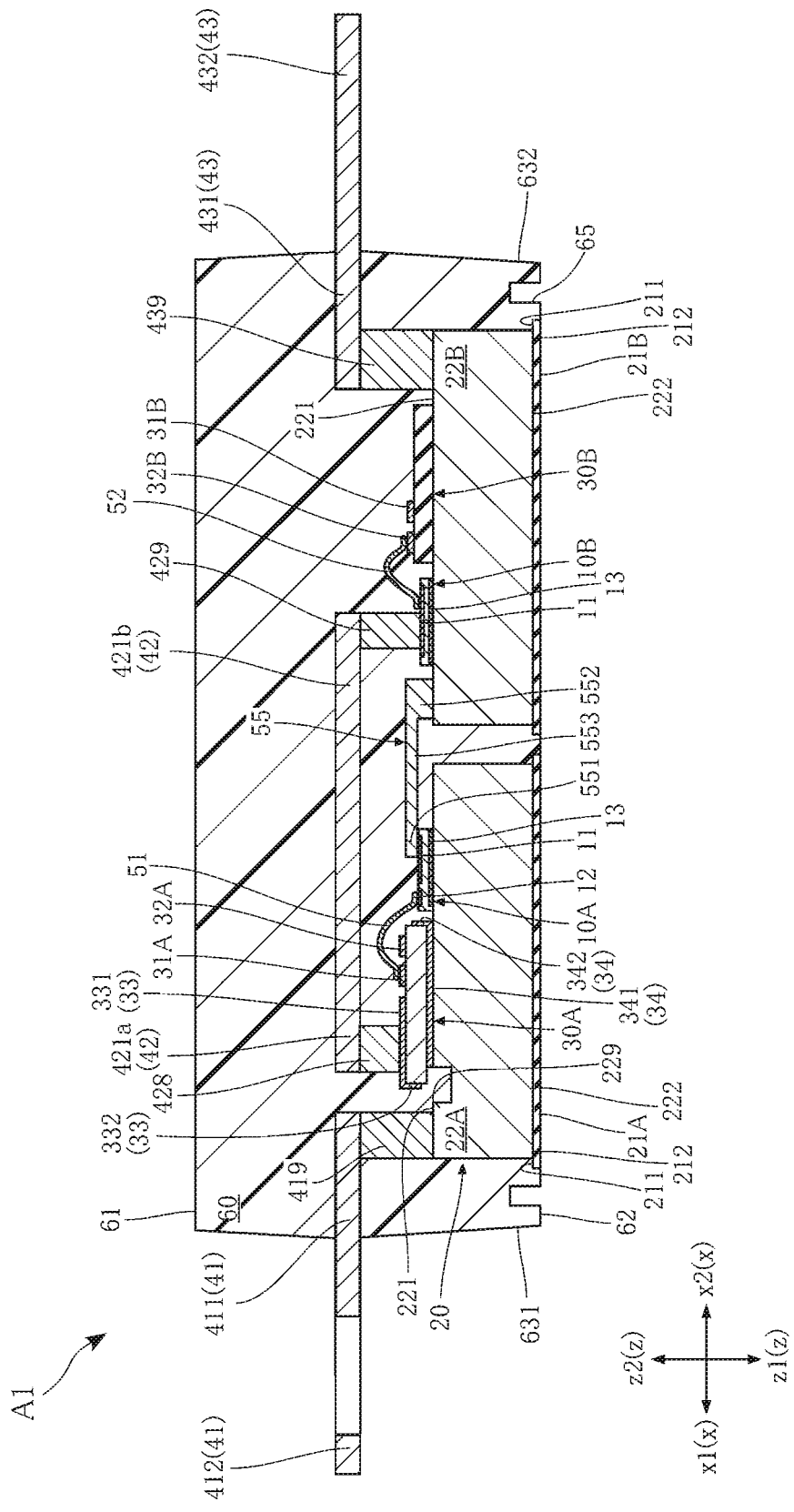
FIG. 22 is a sectional view of the semiconductor device according to the variation.
Figure 23:
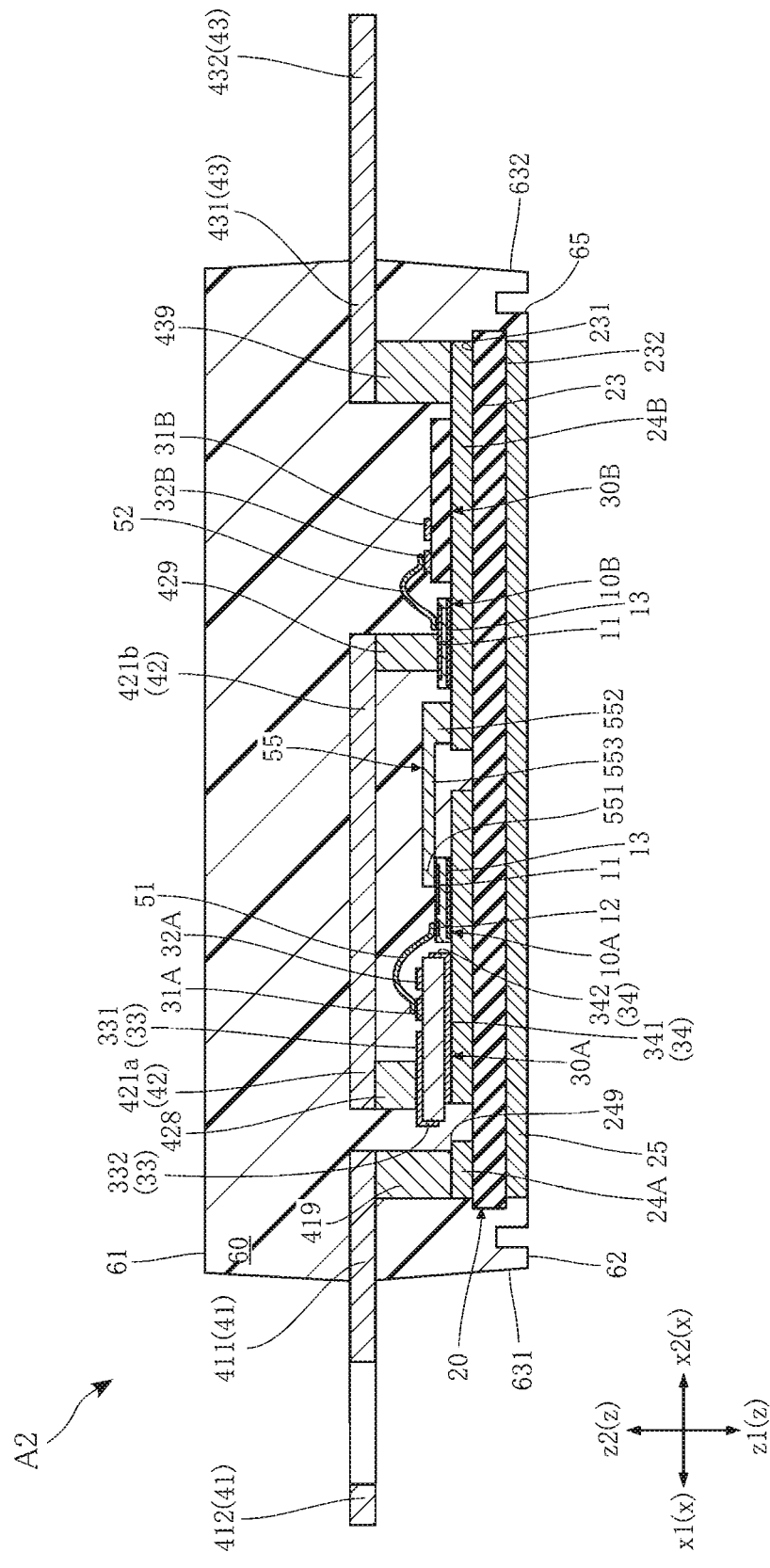
FIG. 23 is a sectional view of a semiconductor device according to a variation.

The first embodiment and the second embodiment show the examples in which the signal substrate 30A includes the insulating film 39. However, the present disclosure is not limited to this, and the signal substrate 30A may not include the insulating film 39. In the semiconductor device A1 having such a structure, an opening 229 may be formed in the obverse surface 221 of the conductive substrate 22A, as shown in FIGS. 21 and 22. The opening 229 overlaps with the side electrode part 332 of the connection terminal 33 in plan view. In the example shown in FIG. 22, a groove recessed from the obverse surface 221 of the conductive substrate 22A in the z direction is formed to provide the opening 229 in the obverse surface 221 of the conductive substrate 22A. Instead of the groove, a through-hole penetrating the conductive substrate 22A in the z direction may be formed. The opening 229 increases the separation distance between the conductive substrate 22A and the connection terminal 33 (side electrode part 332), and hence, secures the insulation between the conductive substrate 22A and the connection terminal 33. The obverse surface 221 of the conductive substrate 22A is an example of "conductive member obverse surface". In the semiconductor device A2, an opening 249 may be formed in the surface of the obverse metal layer 24A that faces in the z2 direction, as shown in FIG. 23. As the opening 229, the opening 249 accepts the side electrode part 332 of the connection terminal 33 in plan view. In the example shown in FIG. 23, a through-hole penetrating the obverse metal layer 24A in the z direction is formed to provide the opening 249 in the surface of the obverse metal layer 24A that faces in the z2 direction. Instead of the through-hole, a groove recessed in the z direction from the surface of the obverse metal layer 24A that faces in the z2 direction may be formed. The opening 249 increases the separation distance between the obverse metal layer 24A and the connection terminal 33 (side electrode part 332), and hence, secures the insulation between the conductive substrate 22A and the connection terminal 33 (side electrode part 332).

Figure 24:
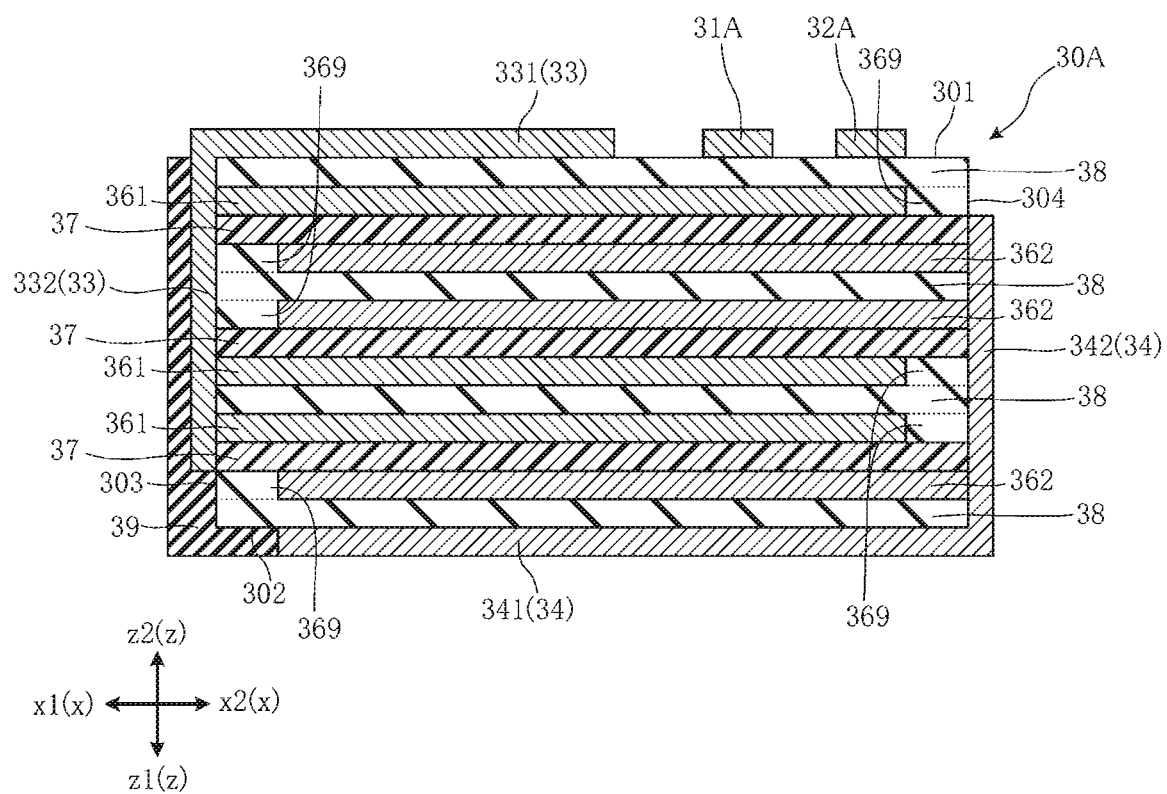
FIG. 24 is a sectional view showing a signal substrate (a capacitor built-in substrate) according to a variation.

In the signal substrate 30A according to the first and second embodiments, the reverse electrode part 341 of the connection terminal 34 functions as an electrode plate of the capacitor while also functioning as an external terminal of the signal substrate 30A. However, the present disclosure is not limited to this. For example, as shown in FIG. 24, the reverse electrode part 341 may not function as an electrode plate of a capacitor but simply functions as an external terminal. Specifically, in the example shown in FIG. 24, the surface layer of the signal substrate 30A on the substrate reverse surface 302 side is provided by an insulating layer 38. With such a configuration, the reverse electrode part 341 does not function as an electrode plate of a capacitor and simply functions as an external terminal electrically connected to the second conductor layers 362 via the side electrode part 342.

The shapes of the gate layers 31A and 31B and detection layers 32A and 32B in plan view are not limited to the above examples (see FIG. 5). The shapes of the gate layers 31A and 31B and detection layers 32A and 32B in plan view according to variations are described below. The signal substrate 30A (the gate layer 31A and the detection layer 32A) is described below as an example, but the signal substrate 30B (the gate layer 31B and the detection layer 32B) may be configured in the same manner.

Figure 25:
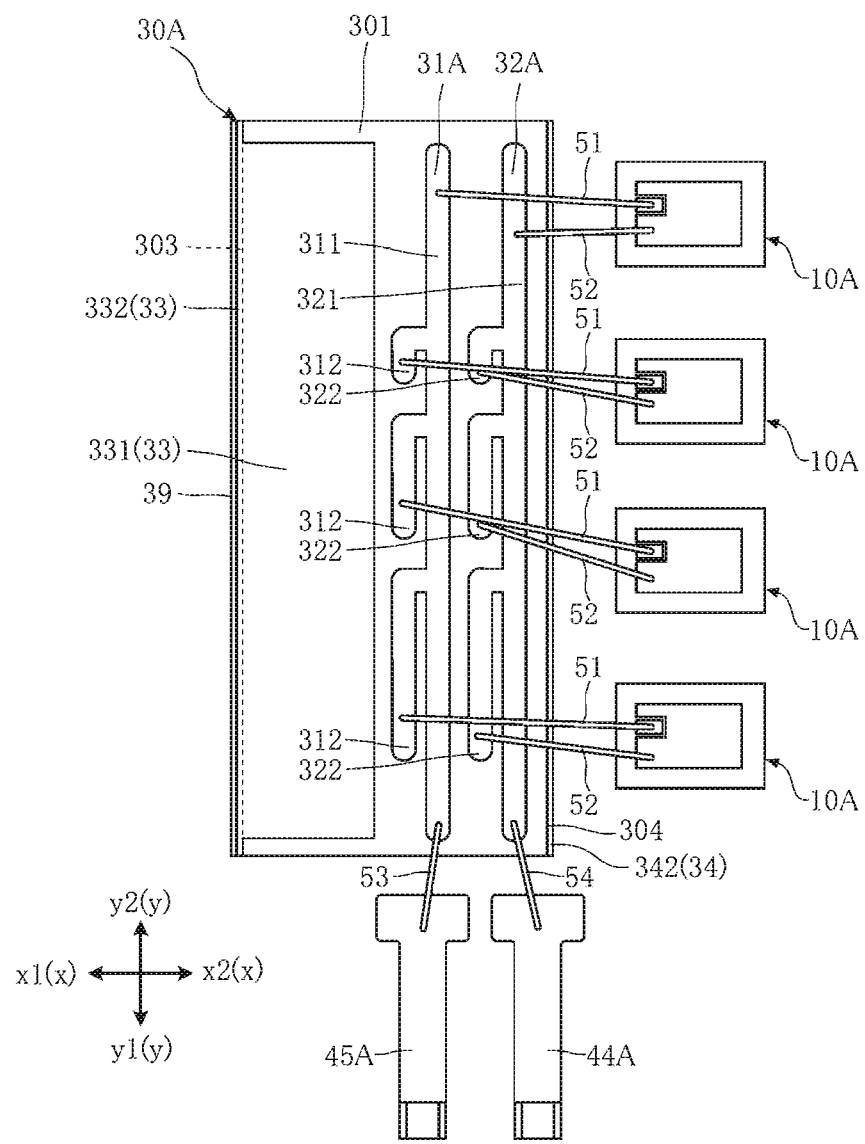
FIG. 25 is a plan view showing a signal substrate (a capacitor built-in substrate) according to a variation.

FIG. 25 is a plan view showing the signal substrate 30A including a gate layer 31A and a detection layer 32A according to a variation. FIG. 25 also shows a plurality of switching elements 10A and two signal terminals 44A and 45A.

As shown in FIG. 25, the gate layer 31A includes a band-shaped portion 311 and a plurality of hook-shaped portions 312. The band-shaped portion 311 is elongated in the y direction. The first connection wire 53 is bonded to an end of the band-shaped portion 311 that is closer to the signal terminals 44A and 45A in the y direction. Each of the hook-shaped portions 312 projects from the band-shaped portion 311 and is L-shaped in plan view. Each gate wire 51 is bonded to an end of a hook-shaped portion 312 (opposite the end connected to the band-shaped portion 311). As a hook-shaped portion 312 gets closer to the first connection wire 53 (i.e., the y1 side in the example of FIG. 25), its elongation in the y direction becomes larger in the band-shaped portion 311. The present variation can substantially equalize the distances from the signal terminal 45A to the second electrode 12 of each switching element 10A through the first connection wire 53, the gate layer 31A, and a gate wire 51. In the example shown in FIG. 25, the gate wire 51 bonded to the switching element 10A positioned furthest in the y2 direction is bonded to the band-shaped portion 311. However, the present disclosure is not limited to this, and this gate wire may be bonded to an additional hook-shaped portion 312, as with other gate wires 51.

As shown in FIG. 25, the detection layer 32A also has a band-shaped portion 321 and a plurality of hook-shaped portions 322, as with the gate layer 31A. The band-shaped portion 321 is elongated in the y direction. The second connection wire 54 is bonded to an end of the band-shaped portion 321 that is closer to the signal terminals 44A and 45A in the y direction. Each of the hook-shaped portions 322 projects from the band-shaped portion 321 and is L-shaped in plan view. Each detection wire 52 is bonded to an end of a hook-shaped portion 322 (opposite the end connected to the band-shaped portion 321). As a hook-shaped portion 322 gets closer to the second connection wire 54 (i.e., the y1 side in the example of FIG. 25), its elongation in the y direction becomes larger in the band-shaped portion 321. The present variation can substantially equalize the distances from the signal terminal 44A to the first electrode 11 of each switching element 10A through the second connection wire 54, the detection layer 32A, and a detection wire 52. In the example shown in FIG. 25, the detection wire 52 bonded to the switching element 10A positioned furthest in the y2 direction is bonded to the band-shaped portion 321. However, the present disclosure is not limited to this, and this detection wire may be bonded to an additional hook-shaped portion 322, as with other detection wires 52.

Figure 26:
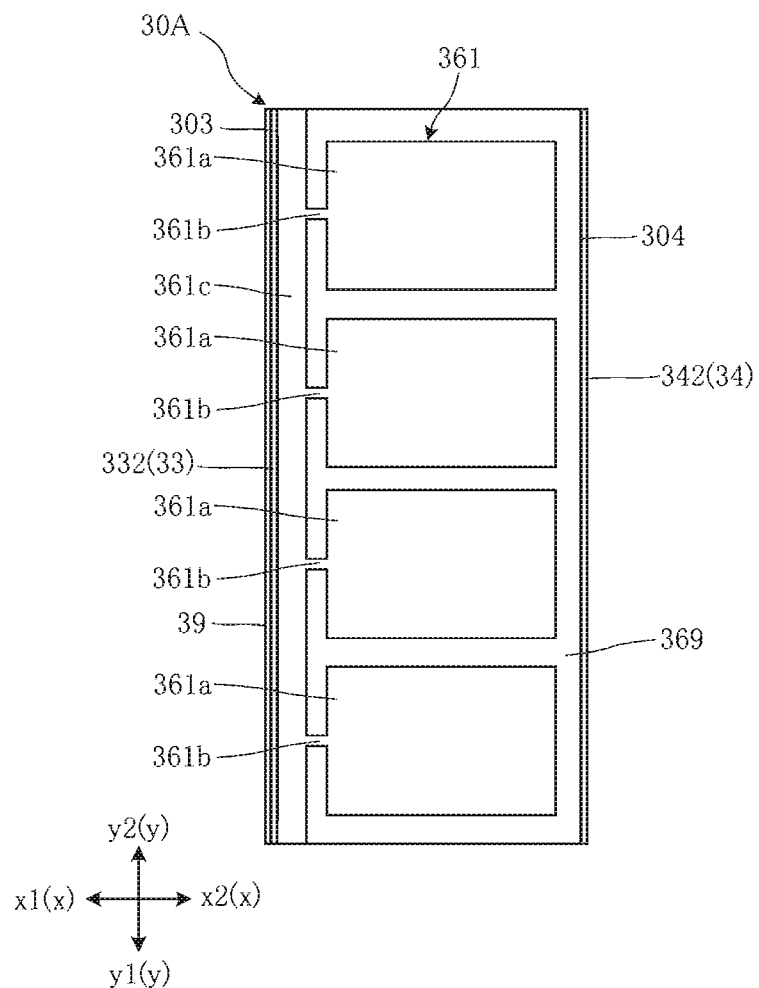
FIG. 26 is a plan view showing a conductor layer according to a variation.

In the signal substrate 30A according to the first and second embodiments, the shape of each first conductor layer 361 in plan view is not limited to the example shown in FIG. 16. For example, the shape in plan view of each first conductor layer 361 may be as shown in FIG. 26. Each first conductor layer 361 in the example shown in FIG. 26 includes a plurality of electrode pattern portions 361a, a plurality of neck pattern portions 361b, and a coupling portion 361c. The electrode pattern portions 361a are rectangular in plan view. The electrode pattern portions 361a are spaced apart from each other and aligned in the y direction. Each of the neck pattern portions 361b is connected to an electrode pattern portion 361a and the coupling portion 361c. The neck pattern portions 361b are smaller in dimension in the y direction than the electrode pattern portions 361a. The coupling portion 361c is elongated in the y direction. The coupling portion 361c is connected to each neck pattern portion 361b and the side electrode part 332 (connection terminal 33). When a defect occurs at some portion of a dielectric layer 37, insulation at the portion deteriorates. Due to such deteriorated insulation, current can flow, through the defective portion, between the first conductor layer 361 and the second conductor layer 362. That is, the first conductor layer 361 and the second conductor layer 362 can be short-circuited, which deteriorates the function as a capacitor. According to the present variation, however, the first conductor layer 361 includes neck pattern portions 361b. A break in the neck pattern portions 361b occurs when current is concentrated on them to generate heat. When a defect occurs at some portion of a dielectric layer 37 as mentioned above, an increased amount of current flows to the electrode pattern portion 361a adjacent to the defective portion. Thus, current concentrates on the neck pattern portion 361b connected to that electrode pattern portion 361a, breaking the neck pattern portion 361b. That is, current is interrupted at the electrode pattern portion 361a in contact with the defective portion, preventing conduction between the first conductor layer 361 and the second conductor layer 362 through the defective portion. Thus, the disadvantages due to such local defect in the dielectric layer 37 (e.g., deterioration of the function as a capacitor) are reduced or eliminated. For each second conductor layer 362 again, the shape in plan view is not limited to the example shown in FIG. 18 and may be similar to the shape in plan view of each first conductor layer 361 shown in FIG. 26. That is, as with the first conductor layer 361 shown in FIG. 26, each second conductor layer 362 may include a plurality of electrode pattern portions, a plurality of neck pattern portions, and a coupling portion.

Figure 27:
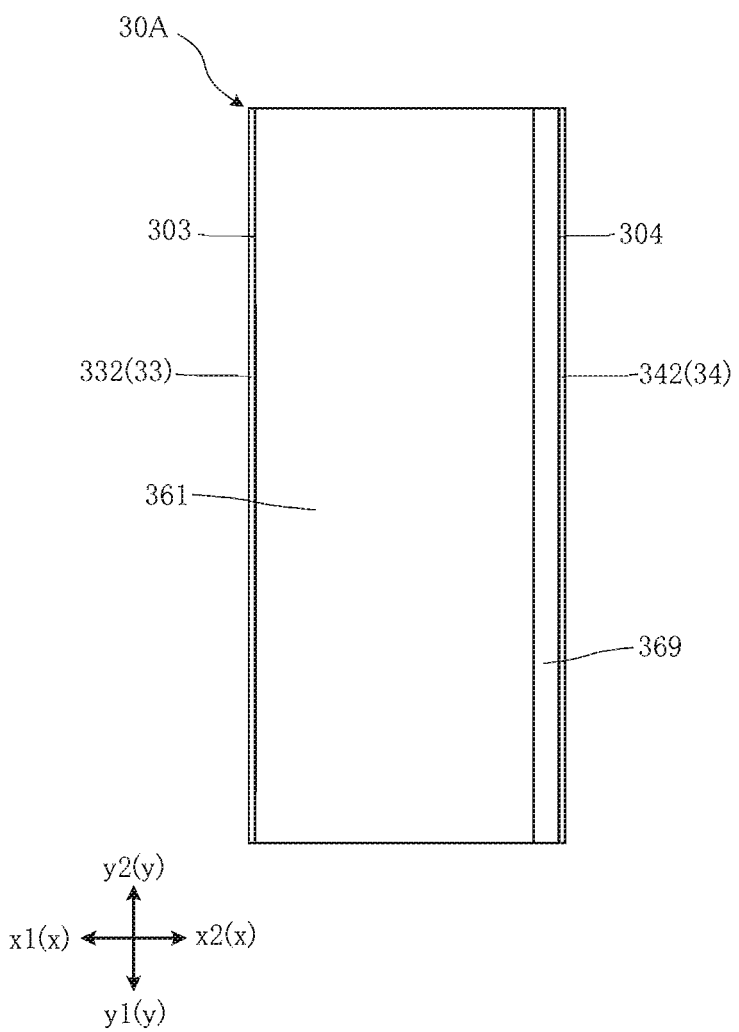
FIG. 27 is a plan view showing a conductor layer according to a variation.

Each first conductor layer 361 may have a shape in plan view as shown in FIG. 27. In the example shown in FIG. 27, each first conductor layer 361 is not formed with an insulator 369 at opposite ends in the y direction and extends from the end on the y2 side to the end on the y1 side of the signal substrate 30A. According to this variation, even when a dielectric layer 37 is thin, the first conductor layer 361 in contact with the dielectric layer 37 can reliably support the dielectric layer 37. Each second conductor layer 362 may also have a shape in plan view similar to that of each first conductor layer 361 shown in FIG. 27. That is, as with the first conductor layer 361 shown in FIG. 27, each second conductor layer 362 is not formed with an insulator 369 at opposite ends in the y direction and extends from the end on the y2 side to the end on the y1 side of the signal substrate 30A. When both the first conductor layers 361 and the second conductor layers 362 are configured as shown in FIG. 27, the first conductor layers 361 and the second conductor layers 362 are exposed at opposite sides of the signal substrate 30A in the y direction. Such a configuration can pose a risk of a short-circuit between the first conductor layers 361 and the second conductor layers 362. To prevent such a short-circuit, an insulating film may be formed on opposite sides of the signal substrate 30A in the y direction.

Figure 28:
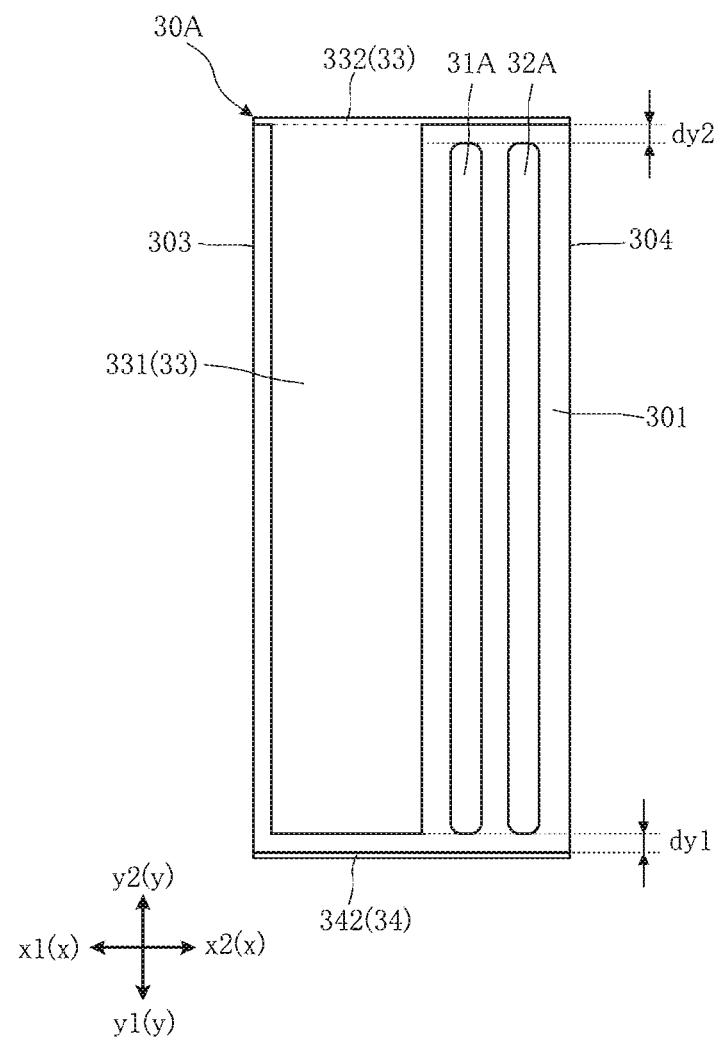
FIG. 28 is a plan view showing a signal substrate (a capacitor built-in substrate) according to a variation.
Figure 29:
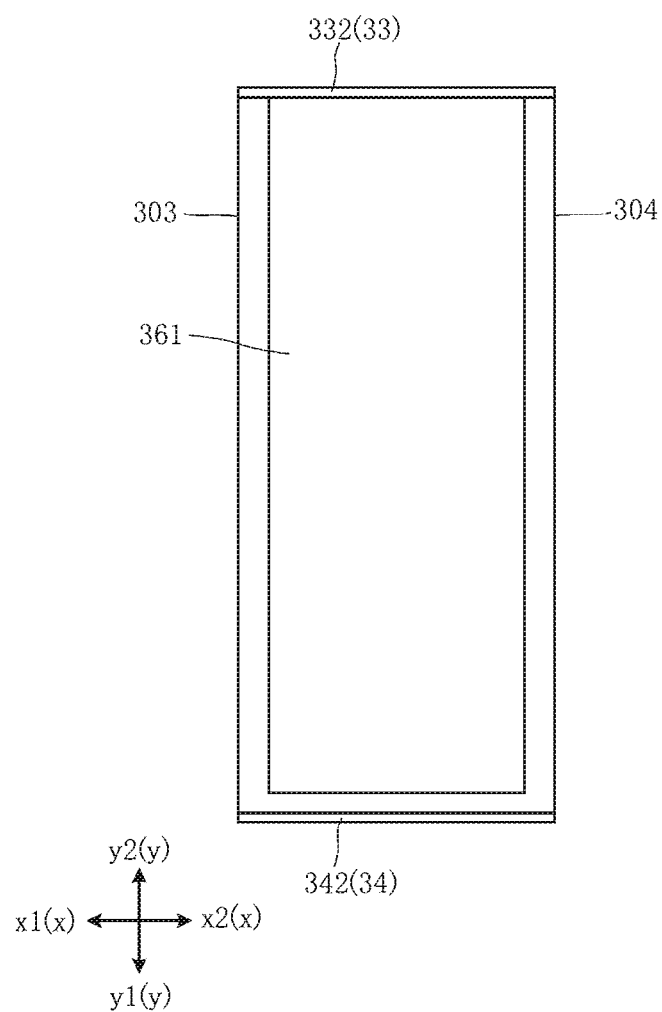
FIG. 29 is a plan view showing a conductor layer of the signal substrate shown in FIG. 28.
Figure 30:
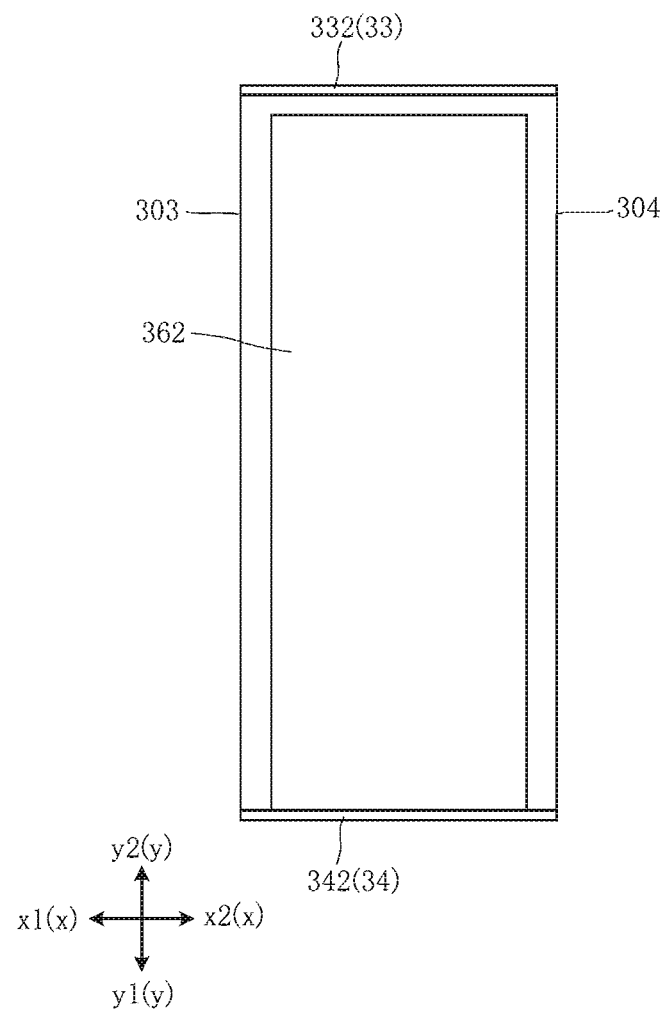
FIG. 30 is a plan view showing a conductor layer of the signal substrate shown in FIG. 28.

The first and second embodiments show an example of the signal substrate 30A in which the side electrode part 332 of the connection terminal 33 is formed on the substrate side surface 303 (the surface facing in the x1 direction) and the side electrode part 342 of the connection terminal 34 is formed on the substrate side surface 304 (the surface facing in the x2 direction). However, present disclosure is not limited to this. As in the example shown in FIG. 28, the two side electrode parts 332 and 342 may be formed on the surface facing in the y1 direction and the surface facing in the y2 direction. In the example shown in FIG. 28, the connection terminal 33 is formed over the substrate obverse surface 301 and the side surface facing in the y2 direction. That is, the side electrode part 332 is formed on the surface of the signal substrate 30A that faces in the y2 direction. The connection terminal 34 is formed over the substrate reverse surface 302 and the side surface facing in the y1 direction. That is, the side electrode part 342 is formed on the surface of the signal substrate 30A that faces in the y1 direction. Conversely, the side electrode part 332 may be formed on the surface facing in the y1 direction and the side electrode part 342 on the surface facing in the y2 direction. In the signal substrate 30A shown in FIG. 28, each first conductor layer 361 and each second conductor layer 362 are in the form of a rectangle elongated in the y direction in plan view, as shown in FIGS. 29 and 30. In the example shown in FIG. 28 again, the separation distance dy1 and the separation distance dy2 are substantially the same as with the example shown in FIG. 13. However, the present disclosure is not limited to this, and these distances may differ from each other.

Figure 31:
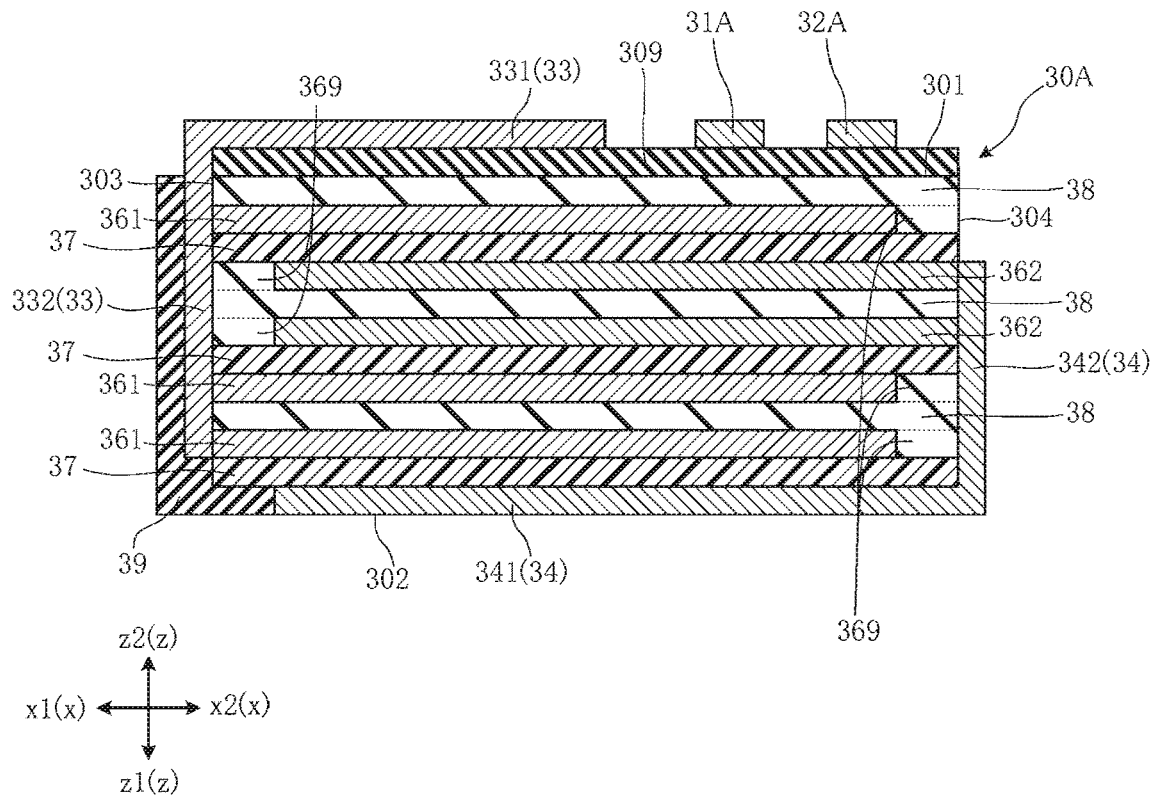
FIG. 31 is a sectional view showing a signal substrate (a capacitor built-in substrate) according to a variation.

The first and second embodiments show an example of the signal substrate 30A in which the obverse electrode part 331 of the connection terminal 33, the gate layer 31A, and the detection layer 32A are formed directly on the substrate obverse surface 301 (the insulating layer 38 as the surface layer). However, the present disclosure is not limited to this. For example, as shown in FIG. 31, the obverse electrode part 331 of the connection terminal 33, the gate layer 31A, and the detection layer 32A may be formed on the substrate obverse surface 301 via an insulating member 309. Such a configuration is also applicable to the signal substrate 30A according to the variations described above.

Figure 32:
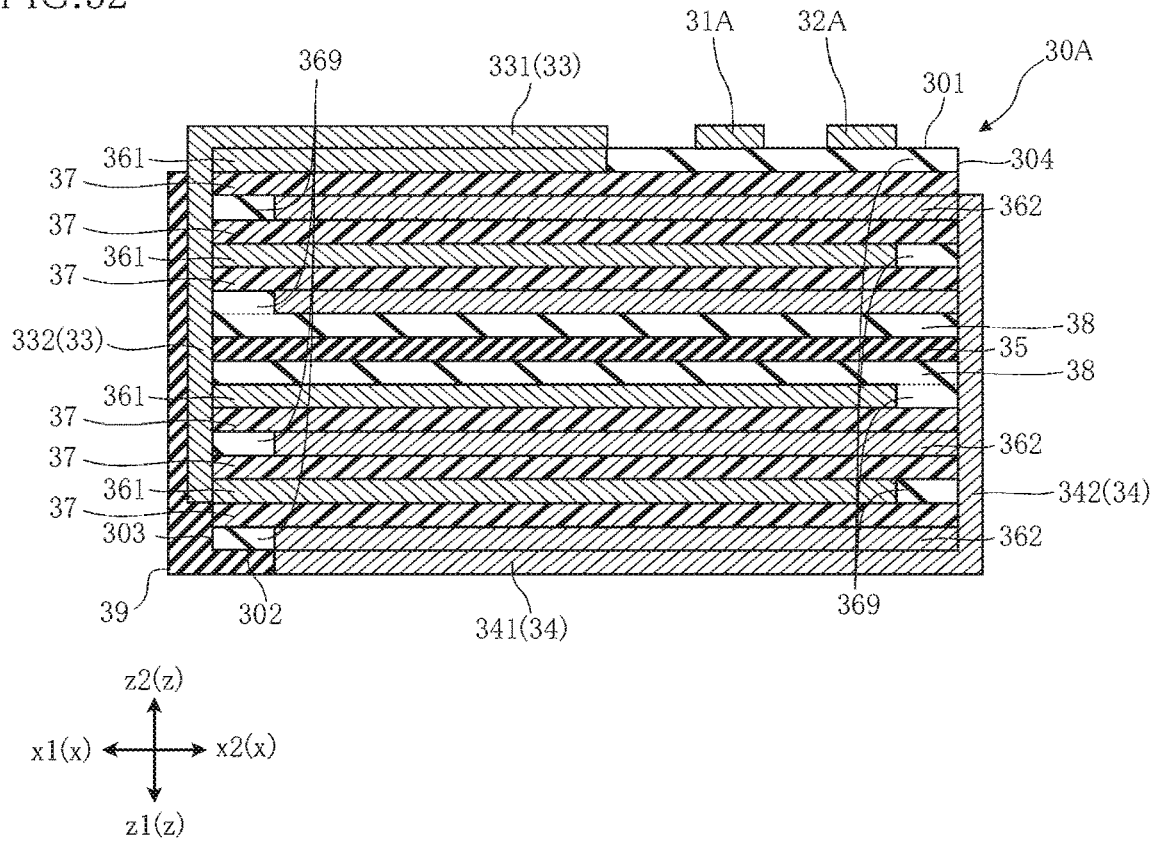
FIG. 32 is a sectional view showing a signal substrate (a capacitor built-in substrate) according to a variation.

In the first and second embodiments, the internal structure (lamination structure) of the signal substrate 30A is not limited to the example shown in FIG. 15. The lamination structure of the signal substrate 30A according to a variation is described below with reference to FIG. 32. FIG. 32 is a sectional view of the lamination structure of the signal substrate 30A according to a variation, taken along the same plane as FIG. 15.

As shown in FIG. 32, the lamination structure of the signal substrate 30A according to the present variation includes a core layer 35, a plurality of first conductor layers 361, a plurality of second conductor layers 362 and a plurality of dielectric layers 37, which are laminated in the z direction.

The core layer 35 is made of an insulating material, which may be FR4 (Flame Retardant Type 4), for example. The FR4 is a glass fiber cloth impregnated with epoxy resin and heat-cured. As shown in FIG. 32, the core layer 35 is disposed in the middle of the signal substrate 30A in the z direction. Insulating layers 38 are formed on the opposite sides of the core layer 35 in the z direction. The insulating layers 38 may be made of prepreg. The insulating layers 38 may not be formed. As shown in FIG. 32, on each side of the core layer 35 in the z direction, first conductor layers 361 and second conductor layers 362 are alternately laminated via dielectric layers 37.

In the signal substrate 30A shown in FIG. 32 again, a first conductor layer 361 and a second conductor layer 362 are disposed to flank a dielectric layer 37. Thus, the first conductor layers 361 and the second conductor layers 362 function as electrode plates of a capacitor. Thus, the signal substrate 30A shown in FIG. 32 also functions as a capacitor.

The first and second embodiments show an example in which each of the signal terminals 44A and 44B is a source-signal detection terminal, and each of the signal terminals 45A and 45B is a gate-signal input terminal. However, the present disclosure is not limited to this, and every signal terminal 44A to 47B and 44B to 47B can be either a source-signal detection terminal or a gate-signal input terminal, depending on the connection of the first connection wire 53 and the second connection wire 54.

The semiconductor device according to the present disclosure is not limited to the foregoing embodiments and variations. The specific configuration of each part of the semiconductor device according to the present disclosure can be varied in design in many ways. For example, the semiconductor device of the present disclosure includes the embodiments described in the following clauses.

Clause 1.
  A semiconductor device comprising:
    a first switching element having a first element obverse surface and a first element reverse surface facing away from each other in a first direction;
    a second switching element having a second element obverse surface and a second element reverse surface facing away from each other in the first direction;
    a first conductive member and a second conductive member spaced apart from each other in a second direction orthogonal to the first direction; and
    a capacitor having a first connection terminal and a second connection terminal,
    wherein the first switching element and the second switching element are connected in series to form a bridge,
    the first connection terminal and the second connection terminal are electrically connected to opposite ends of the bridge,
    the capacitor and the first switching element are mounted on the first conductive member, and
    the second switching element is mounted on the second conductive member.

Clause 2.
  The semiconductor device according to clause 1, wherein the capacitor has a capacitor obverse surface and a capacitor reverse surface spaced apart from each other in the first direction,
    the first connection terminal includes an obverse electrode part formed on a portion of the capacitor obverse surface, and
    the second connection terminal includes a reverse electrode part formed on a portion of the capacitor reverse surface.

Clause 3.
  The semiconductor device according clause 2, wherein the capacitor has a first capacitor side surface and a second capacitor side surface spaced apart from each other in a orthogonal direction orthogonal to the first direction,
    each of the first capacitor side surface and the second capacitor side surface is connected to the capacitor obverse surface and the capacitor reverse surface,
    the first connection terminal further includes a first side electrode part connected to the obverse electrode part and formed on a portion of the first capacitor side surface, and
    the second connection terminal further includes a second side electrode part connected to the reverse electrode part and formed on a portion of the second capacitor side surface.

Clause 4.
  The semiconductor device according to clause 3, wherein the orthogonal direction and the second direction correspond with each other.

Clause 5.
  The semiconductor device according to clause 3 or 4, wherein on the capacitor an insulating film is formed that insulates between the first side electrode part and the first conductive member.

Clause 6.
  The semiconductor device according to clause 3 or 4, wherein the first conductive member has a conductive member obverse surface facing a side that the capacitor obverse surface faces in the first direction, and
    on the conductive member obverse surface an opening is formed that accepts the first side electrode part as viewed in the first direction.

Clause 7.
  The semiconductor device according to any of clauses 3 to 6, wherein the capacitor includes a plurality of first conductor layers, a plurality of second conductor layers and a plurality of dielectric layers that are laminated in the first direction,
    the plurality of first conductor layers are connected to the first side electrode part,
    the plurality of second conductor layers are connected to the second side electrode part, and
    each of the plurality of dielectric layers is sandwiched between one of the plurality of first conductor layers and one of the plurality of second conductor layers.

Clause 8.
  The semiconductor device according to clause 7, wherein the capacitor includes a plurality insulating layers laminated in the first direction,
    the plurality of insulating layers include a first insulating layer and a second insulating layer, the first insulating layer being sandwiched between two of the first conductor layers between two of the dielectric layers that are adjacent in the first direction, and the second insulating layer being sandwiched between two of the second conductor layers between two of the dielectric layers that are adjacent in the first direction.

Clause 9.
  The semiconductor device according to any of clauses 3 to 8, wherein the first switching element further includes a drive signal input electrode which is formed on the first element obverse surface and to which a drive signal is inputted,
    the capacitor further includes a wiring layer formed on the capacitor obverse surface and spaced apart from the obverse electrode part, and a drive signal for the first switching element is input to the wiring layer.

Clause 10.
The semiconductor device according to clause 9, wherein the wiring layer is formed on the capacitor obverse surface via an insulating member.

Clause 11.
The semiconductor device according to any of clauses 1 to 10, wherein each of the first switching element and the second switching element has a switching frequency of 10 kHz or higher.

Clause 12.
The semiconductor device according to any of clauses 1 to 11, wherein a path of current flowing through the capacitor, the first switching element and the second switching element has an inductance of 10 nH or lower.

Clause 13.
The semiconductor device according to any of clauses 1 to 12, wherein the first switching element and the second switching element are made of a wide-band-gap semiconductor material.

Clause 14.
The semiconductor device according to clause 13, wherein the wide-band-gap semiconductor material is SiC.

Clause 15.
The semiconductor device according to any of clauses 1 to 14, wherein the first switching element includes a first obverse electrode formed on the first element obverse surface and a first reverse electrode formed on the first element reverse surface,
the second switching element includes a second obverse electrode formed on the second element obverse surface and a second reverse electrode formed on the second element reverse surface,
the first reverse electrode is bonded to the first conductive member,
the second reverse electrode is bonded to the second conductive member,
the second connection terminal is bonded to the first conductive member,
the first obverse electrode and the second conductive member are electrically connected, and
the second obverse electrode and the first connection terminal are electrically connected.

Clause 16.
The semiconductor device according to clause 15, further comprising:
a first input terminal electrically connected to the first reverse electrode via the first conductive member;
a second input terminal electrically connected to the second obverse electrode and the first connection terminal;
an output terminal electrically connected to the second reverse electrode via the second conductive member, and
a connector electrically connecting the first obverse electrode and the second conductive member.

Clause 17.
The semiconductor device according to clause 16, further comprising a resin member covering the first switching element and the second switching element,
wherein each of the first input terminal, the second input terminal, and the output terminal is partially exposed from the resin member.

Clause 18.
The semiconductor device according to any of clauses 1 to 17, further comprising:
an additional first switching element mounted on the first conductive member and connected in parallel to the first switching element, and
an additional second switching element mounted on the second conductive member and connected in parallel to the second switching element.

LIST OF REFERENCE CHARACTERS

A1, A2: Semiconductor device
10, 10A, 10B: Switching element
101: Element obverse surface
102: Element reverse surface
11: First electrode
12: Second electrode
13: Third electrode
14: Insulating film
20: Supporting substrate
21A, 21B: Insulating substrate
211: Obverse surface
212: Reverse surface
22A, 22B: Conductive substrate
221: Obverse surface
222: Reverse surface
229: Opening
23: Insulating substrate
231: Obverse surface
232: Reverse surface
24A, 24B: Obverse metal layer
249: Opening
25: Reverse metal layer
30A, 30B: Signal substrate
301: Substrate obverse surface
302: Substrate reverse surface
303, 304: Substrate side surface
309: Insulating member
31A, 31B: Gate layer
311: Band-shaped portion
312: Hook-shaped portion
32A, 32B: Detection layer
321: Band-shaped portion
322: Hook-shaped portion
33, 34: Connection terminal
331: Obverse electrode part
332: Side electrode part
341: Reverse electrode part
342: Side electrode part
35: Core layer
361: First conductor layer
361a: Electrode pattern portion
361b: Neck pattern portion
361c: Coupling portion
362: Second conductor layer
369: Insulating member
37: Dielectric layer
38: Insulating layer
39: Insulating film
41, 42: Input terminal
411, 421: Pad portion
412, 422: Terminal portion
421a: Coupling portion
421b: Extension
421c: Connecting portion
419, 428, 429: Block
43: Output terminal
431: Pad portion
432: Terminal portion 439: Block
44A-47A, 44B-47B: Signal terminal
441, 451, 461, 471: Pad portion
442, 452, 462, 472: Terminal portion
50: Connector
51: Gate wire
52: Detection wire
53: First connection wire
54: Second connection wire
55: Lead member
551: First bond portion
552: Second bond portion
553: Intermediate portion
60: Resin member
61: Resin obverse surface
62: Resin reverse surface
631-634: Resin side surface
65: Recess

The invention claimed is:

1. A semiconductor device comprising:
a first switching element having a first element obverse surface and a first element reverse surface facing away from each other in a first direction;
a second switching element having a second element obverse surface and a second element reverse surface facing away from each other in the first direction;
a first conductive member and a second conductive member spaced apart from each other in a second direction orthogonal to the first direction;
a capacitor having a first connection terminal and a second connection terminal;
a first conductive block bonded to the first connection terminal;
a second conductive block bonded to the second switching element; and
a coupling portion that couples the first conductive block and the second conductive block,
wherein the first switching element and the second switching element are connected in series to form a bridge,
the first connection terminal and the second connection terminal are electrically connected to opposite ends of the bridge,
the capacitor and the first switching element are mounted on the first conductive member, and
the second switching element is mounted on the second conductive member.

2. The semiconductor device according to claim 1, wherein the capacitor has a capacitor obverse surface and a capacitor reverse surface spaced apart from each other in the first direction,
the first connection terminal includes an obverse electrode part formed on a portion of the capacitor obverse surface, and
the second connection terminal includes a reverse electrode part formed on a portion of the capacitor reverse surface.

3. The semiconductor device according to claim 2, wherein the capacitor has a first capacitor side surface and a second capacitor side surface spaced apart from each other in an orthogonal direction orthogonal to the first direction,
each of the first capacitor side surface and the second capacitor side surface is connected to the capacitor obverse surface and the capacitor reverse surface,
the first connection terminal further includes a first side electrode part connected to the obverse electrode part and formed on a portion of the first capacitor side surface, and
the second connection terminal further includes a second side electrode part connected to the reverse electrode part and formed on a portion of the second capacitor side surface.

4. The semiconductor device according to claim 3, wherein the orthogonal direction and the second direction correspond with each other.

5. The semiconductor device according to claim 3, wherein on the capacitor an insulating film is formed that insulates between the first side electrode part and the first conductive member.

6. The semiconductor device according to claim 3, wherein the first conductive member has a conductive member obverse surface facing a side that the capacitor obverse surface faces in the first direction, and
on the conductive member obverse surface an opening is formed that accepts the first side electrode part as viewed in the first direction.

7. The semiconductor device according to claim 3, wherein the capacitor includes a plurality of first conductor layers, a plurality of second conductor layers and a plurality of dielectric layers that are laminated in the first direction,
the plurality of first conductor layers are connected to the first side electrode part,
the plurality of second conductor layers are connected to the second side electrode part, and
each of the plurality of dielectric layers is sandwiched between one of the plurality of first conductor layers and one of the plurality of second conductor layers.

8. The semiconductor device according to claim 7, wherein the capacitor includes a plurality of insulating layers laminated in the first direction,
the plurality of insulating layers include a first insulating layer and a second insulating layer, the first insulating layer being sandwiched between two of the first conductor layers between two of the dielectric layers that are adjacent in the first direction, and the second insulating layer being sandwiched between two of the second conductor layers between two of the dielectric layers that are adjacent in the first direction.

9. The semiconductor device according to claim 3, wherein the first switching element further includes a drive signal input electrode which is formed on the first element obverse surface and to which a drive signal is inputted,
the capacitor further includes a wiring layer formed on the capacitor obverse surface and spaced apart from the obverse electrode part, and
a drive signal for the first switching element is input to the wiring layer.

10. The semiconductor device according to claim 9, wherein the wiring layer is formed on the capacitor obverse surface via an insulating member.

11. The semiconductor device according to claim 1, wherein each of the first switching element and the second switching element has a switching frequency of 10 kHz or higher.

12. The semiconductor device according to claim 1, wherein a path of current flowing through the capacitor, the first switching element and the second switching element has an inductance of 10 nH or lower.

13. The semiconductor device according to claim 1, wherein the first switching element and the second switching element are made of a wide-band-gap semiconductor material.

14. The semiconductor device according to claim 13, wherein the wide-band-gap semiconductor material is SiC.

15. The semiconductor device according to claim 1, wherein the first switching element includes a first obverse electrode formed on the first element obverse surface and a first reverse electrode formed on the first element reverse surface, the second switching element includes a second obverse electrode formed on the second element obverse surface and a second reverse electrode formed on the second element reverse surface, the first reverse electrode is bonded to the first conductive member, the second reverse electrode is bonded to the second conductive member, the second connection terminal is bonded to the first conductive member, the first obverse electrode and the second conductive member are electrically connected, and the second obverse electrode and the first connection terminal are electrically connected.

16. The semiconductor device according to claim 15, further comprising:

a first input terminal electrically connected to the first reverse electrode via the first conductive member;

a second input terminal electrically connected to the second obverse electrode and the first connection terminal;

an output terminal electrically connected to the second reverse electrode via the second conductive member, and a connector electrically connecting the first obverse electrode and the second conductive member.

17. The semiconductor device according to claim 16, further comprising a resin member covering the first switching element and the second switching element, wherein each of the first input terminal, the second input terminal, and the output terminal is partially exposed from the resin member.

18. The semiconductor device according to claim 1, further comprising:

an additional first switching element mounted on the first conductive member and connected in parallel to the first switching element, and an additional second switching element mounted on the second conductive member and connected in parallel to the second switching element.

19. The semiconductor device according to claim 16, further comprising a plurality of first connection members, wherein the plurality of first connection members conduct between the first obverse electrode and the second conductive member.

* * * * *